(12) United States Patent
Papandreou et al.

(10) Patent No.: US 11,036,415 B2
(45) Date of Patent: Jun. 15, 2021

(54) MANAGING MEMORY BLOCK CALIBRATION BASED ON PRIORITY LEVELS

(71) Applicant: International Business Machines Corporation, Armonk, NY (US)

(72) Inventors: Nikolaos Papandreou, Thalwil (CH); Roman Alexander Pletka, Uster (CH); Aaron Daniel Fry, Richmond, TX (US); Timothy Fisher, Cypress, TX (US); Nikolas Ioannou, Zurich (CH); Charalampos Pozidis, Thalwil (CH); Radu Ioan Stoica, Zurich (CH); Sasa Tomic, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 16/669,190

(22) Filed: Oct. 30, 2019

(65) Prior Publication Data
US 2021/0132800 A1 May 6, 2021

(51) Int. Cl.
*G06F 12/00* (2006.01)
*G06F 3/06* (2006.01)
*G06F 11/30* (2006.01)
*G06F 11/34* (2006.01)

(52) U.S. Cl.
CPC ............ *G06F 3/064* (2013.01); *G06F 3/0614* (2013.01); *G06F 3/0659* (2013.01); *G06F 3/0679* (2013.01); *G06F 11/3034* (2013.01); *G06F 11/3495* (2013.01)

(58) Field of Classification Search
CPC ........ G06F 3/061; G06F 3/064; G06F 3/0614; G06F 3/0659; G06F 3/0679; G06F 11/3034; G06F 11/3495; G06F 12/0246; G06F 2212/7211
See application file for complete search history.

(56) References Cited

U.S. PATENT DOCUMENTS

| 10,236,070 | B2 | 3/2019 | Barndt et al. |
| 2017/0003880 | A1* | 1/2017 | Fisher ................. G06F 12/0246 |
| 2019/0042154 | A1 | 2/2019 | Gaewsky et al. |
| 2019/0073295 | A1 | 3/2019 | Lee |

OTHER PUBLICATIONS

Takeuchi, K., "Data-Aware NAND Flash Memory for Intelligent Computing with Deep Neural Network," IEEE International Electron Devices Meeting (IEDM), 2017, pp. 28A.1-28.4.4.

* cited by examiner

*Primary Examiner* — Shawn X Gu
(74) *Attorney, Agent, or Firm* — Zilka-Kotab, P.C.

(57) ABSTRACT

A computer-implemented method, according to one embodiment, is for managing block calibration operations. The computer-implemented method includes: determining a type of calibration procedure to apply to a block of memory, and assigning the calibration type to the block. A calibration level to assign to the block is also determined, and thereafter the calibration level is assigned to the block. Moreover, the block is assigned to one of two or more calibration queues based on the calibration type and calibration level associated with the block. A different priority level is assigned to each of the calibration queues, and the priority levels determine an order in which blocks assigned to the calibration queues are calibrated.

20 Claims, 15 Drawing Sheets

MANAGING MEMORY BLOCK CALIBRATION BASED ON PRIORITY LEVELS

BACKGROUND

The present invention relates to data storage systems, and more particularly, this invention relates to managing the calibration of blocks of non-volatile random access memory (NVRAM) using priority levels.

NVRAM is a type of random-access memory which retains information stored thereon even after the power supply is turned off, and includes a number of different forms. Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

The raw bit error rate (RBER) of a Flash memory block will typically increase over time due to additional program/erase (P/E) cycling, charge leakage over time (i.e., data retention), and additional charge placed in the cells by read or program operations (i.e., read or program disturb errors, respectively). Typically, a Flash memory block is retired when any page in the block exhibits a code word that reaches a page retirement error count limit. This limit is typically set to be achieved in conjunction with an appropriate error correction code (ECC), resulting in the Uncorrectable Bit Error Rate (UBER) after applying the ECC for a Flash memory block being set to be similar to the UBER in traditional hard disk drives, e.g., at around $10^{-15}$, but may be more or less.

Block and/or page calibration, which refers to algorithms that adjusts read voltages, has been shown to significantly improve the RBER and therefore enhance endurance and retention, particularly for enterprise-level Flash memory systems using modern three-dimensional (3-D) triple-level-cell (TLC) or quad-level-cell (QLC) NAND Flash memory. Previous attempts to maintain efficient memory performance typically included inspecting the read voltages for each block of memory in a sweeping fashion or by a read voltage shifting algorithm that tracks and corrects the read voltages depending on how the threshold voltage distributions have changed as a result of cycling or retention or other disturbing effects.

SUMMARY

A computer-implemented method, according to one embodiment, is for managing block calibration operations. The computer-implemented method includes: determining a type of calibration procedure to apply to a block of memory, and assigning the calibration type to the block. A calibration level to assign to the block is also determined, and thereafter the calibration level is assigned to the block. Moreover, the block is assigned to one of two or more calibration queues based on the calibration type and calibration level associated with the block. A different priority level is assigned to each of the calibration queues, and the priority levels determine an order in which blocks assigned to the calibration queues are calibrated.

A computer program product, according to another embodiment, is for managing block calibration operations. The computer program product includes a computer readable storage medium having program instructions embodied therewith. Moreover, the program instructions are readable and/or executable by a processor to cause the processor to: perform the foregoing method.

A system, according to yet another embodiment, includes: a plurality of non-volatile random access memory (NVRAM) blocks configured to store data, a processor, and logic integrated with and/or executable by the processor. The logic is configured to, for each of the blocks: perform the foregoing method.

Other aspects and embodiments of the present invention will become apparent from the following detailed description, which, when taken in conjunction with the drawings, illustrate by way of example the principles of the invention.

DETAILED DESCRIPTION

Figure 1:
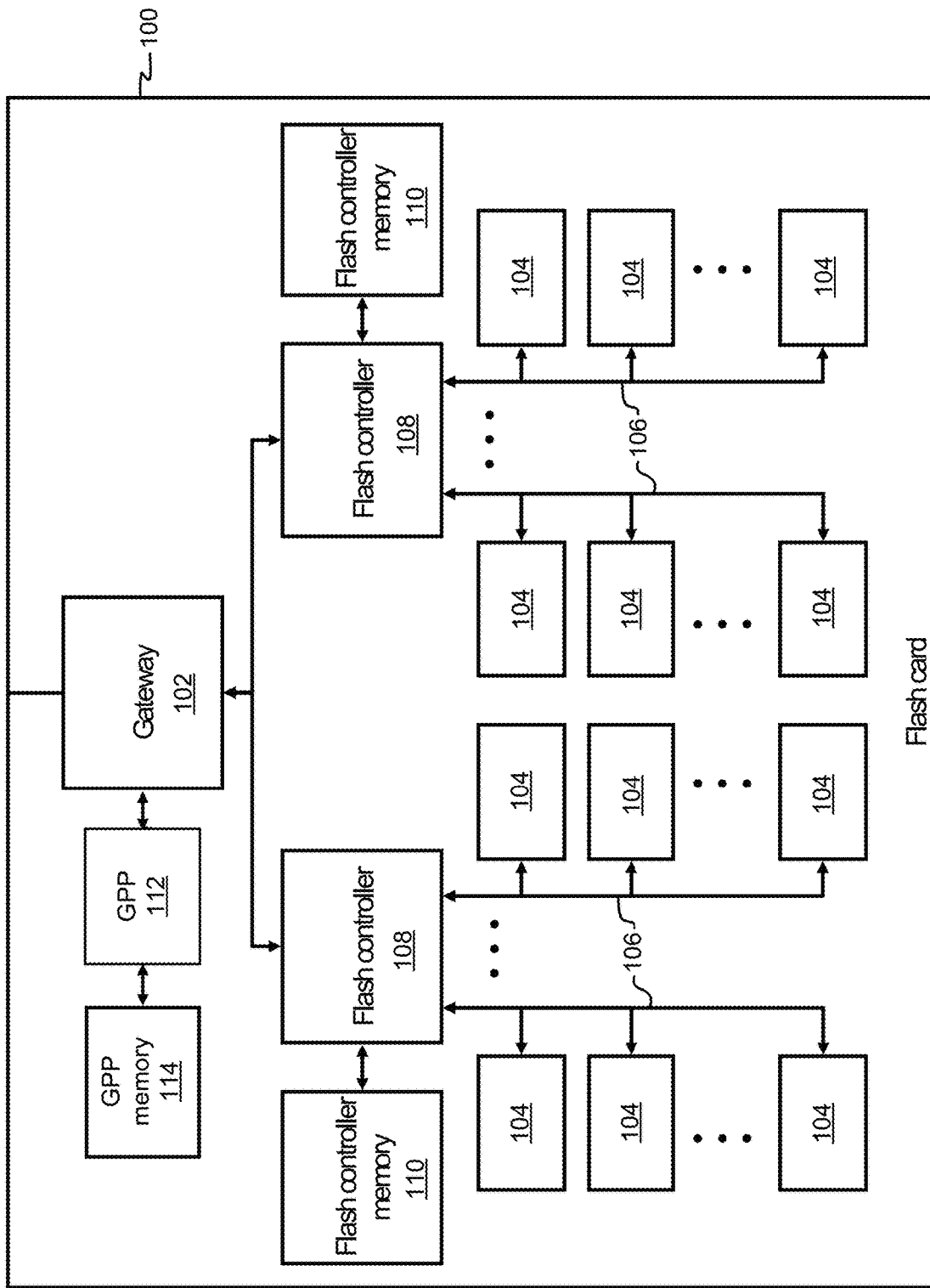
FIG. 1 is a diagram of a non-volatile memory card, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the"

include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several approaches of data storage systems, as well as operation and/or component parts thereof. It should be appreciated that various approaches herein can be implemented with a wide range of memory mediums, including for example NVRAM technologies such as NAND Flash memory, NOR Flash memory, phase-change memory (PCM), magnetoresistive RAM (MRAM) and resistive RAM (RRAM). To provide a context, and solely to assist the reader, various approaches may be described with reference to a type of non-volatile memory. This has been done by way of example only, and should not be deemed limiting on the invention defined in the claims.

In one general embodiment, a computer-implemented method is for managing block calibration operations. The computer-implemented method includes: determining a type of calibration procedure to apply to a block of memory, and assigning the calibration type to the block. A calibration level to assign to the block is also determined, and thereafter the calibration level is assigned to the block. Moreover, the block is assigned to one of two or more calibration queues based on the calibration type and calibration level associated with the block. A different priority level is assigned to each of the calibration queues, and the priority levels determine an order in which blocks assigned to the calibration queues are calibrated.

In another general embodiment, a computer program product is for managing block calibration operations. The computer program product includes a computer readable storage medium having program instructions embodied therewith. Moreover, the program instructions are readable and/or executable by a processor to cause the processor to: perform the foregoing method.

In yet another general embodiment, a system includes: a plurality of non-volatile random access memory (NVRAM) blocks configured to store data, a processor, and logic integrated with and/or executable by the processor. The logic is configured to, for each of the blocks: perform the foregoing method.

FIG. 1 illustrates a memory card 100, in accordance with one embodiment. It should be noted that although memory card 100 is depicted as an exemplary non-volatile data storage card in the present embodiment, various other types of non-volatile data storage cards may be used in a data storage system according to alternate embodiments. It follows that the architecture and/or components of memory card 100 are in no way intended to limit the invention, but rather have been presented as a non-limiting example.

Moreover, as an option, the present memory card 100 may be implemented in conjunction with features from any other embodiment listed herein, such as those described with reference to the other FIGS. However, such memory card 100 and others presented herein may be used in various applications and/or in permutations which may or may not be specifically described in the illustrative embodiments listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various approaches, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various approaches.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various approaches described herein. However, depending on the desired approach, the controller memory 110 may be battery-backed DRAM, phase-change memory PC-RAM, MRAM, STT-MRAM, etc., or a combination thereof.

Figure 2:
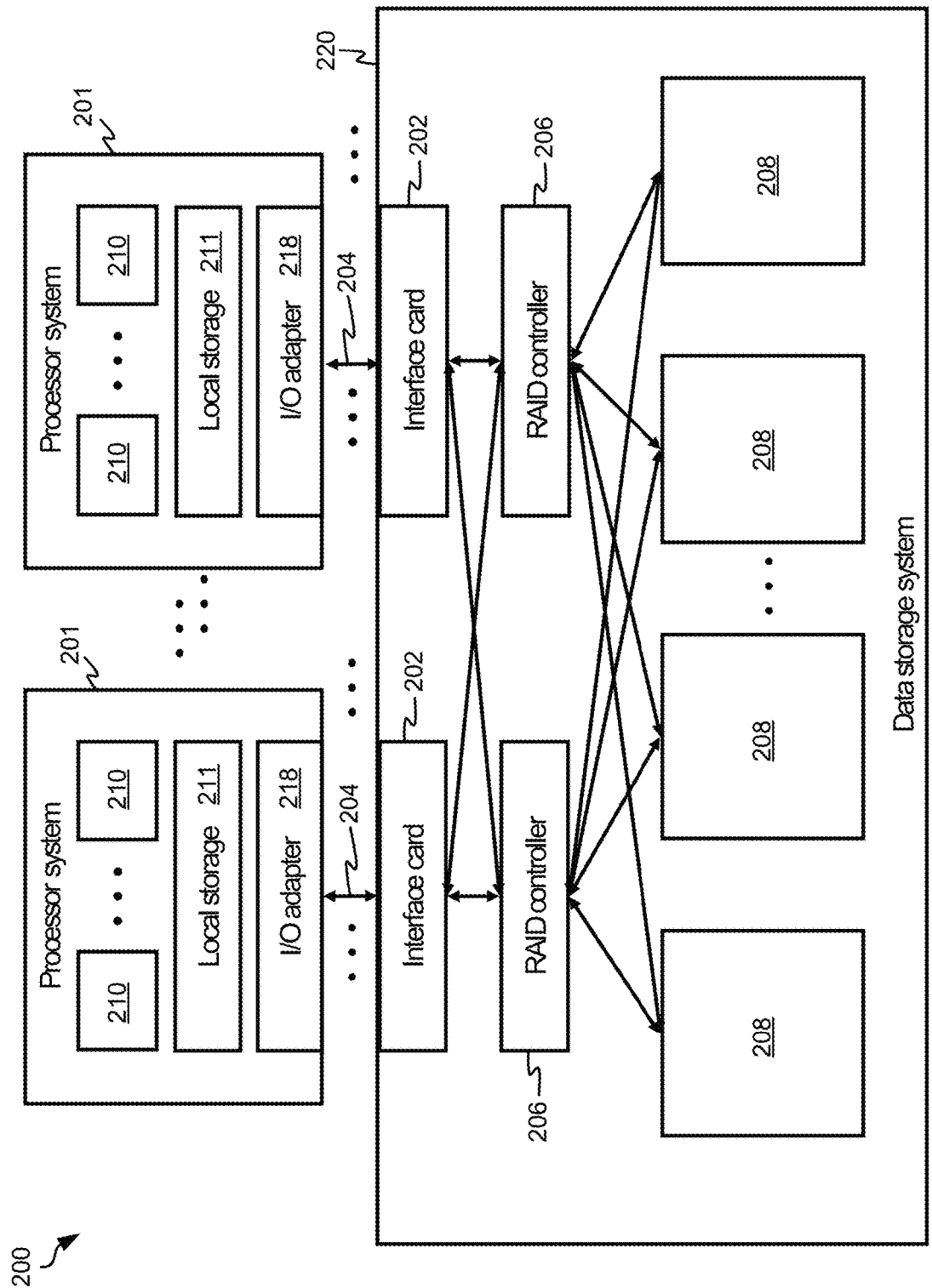
FIG. 2 is a diagram of a data storage system architecture, in accordance with one embodiment.

As previously mentioned, memory card 100 may be implemented in various types of data storage systems, depending on the desired approach. FIG. 2 illustrates a data storage system architecture 200 according to an exemplary embodiment which is in no way intended to limit the invention. Moreover, it should be noted that the data storage system 220 of FIG. 2 may include various components found in the approach of FIG. 1.

Looking to FIG. 2, the data storage system 220 comprises a number of interface cards 202 configured to communicate via I/O interconnections 204 to one or more processor systems 201. The data storage system 220 may also comprise one or more Redundant Array of Independent Disks (RAID) controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-6, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1014 of FIG. 10, ROM 1016 of FIG. 10, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired approach. Specifically, memory controllers may include logic configured to perform any one or more of the following functions, which are in no way intended to be an exclusive list. In other words, depending on the desired approach, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, logical erase blocks (LEBs) may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or Flash channels are grouped together, such that blocks from the same group can be read or written in parallel, thereby increasing overall bandwidth. It is also possible to combine the previous two methods, and to compose RAID stripes using blocks from different Flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary approach, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the logical to physical table (LPT) mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some approaches. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, write heat segregation may be achieved. In particular, write heat segregating methods may group write hot memory pages together in certain memory blocks while write cold memory pages are grouped together in separate memory blocks. Thus, a write heat segregated LEB tends to be occupied by either write hot or cold data.

The merit of write heat segregation is two-fold. First, performing a garbage collection process on a write hot memory block will prevent triggering the relocation of write cold data as well. In the absence of heat segregation, updates to write hot data, which are performed frequently, also results in the undesirable relocations of all write cold data collocated on the same LEB as the hot data being relocated. Therefore, the write amplification incurred by performing garbage collection is much lower for approaches implementing write heat segregation.

Secondly, the relative write heat of data can be utilized for wear leveling purposes. For example, write hot data may be placed in healthier (e.g., younger) memory blocks, while write cold data may be placed on less healthy (e.g., older) memory blocks relative to those healthier memory blocks. Thus, the rate at which relatively older blocks are exposed to wear is effectively slowed, thereby improving the overall endurance of a given data storage system implementing write heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired approach, logic of a storage system may be configured to perform additional or alternative functions, as would be appreciated by one skilled in the art upon reading the present description.

Figure 3:
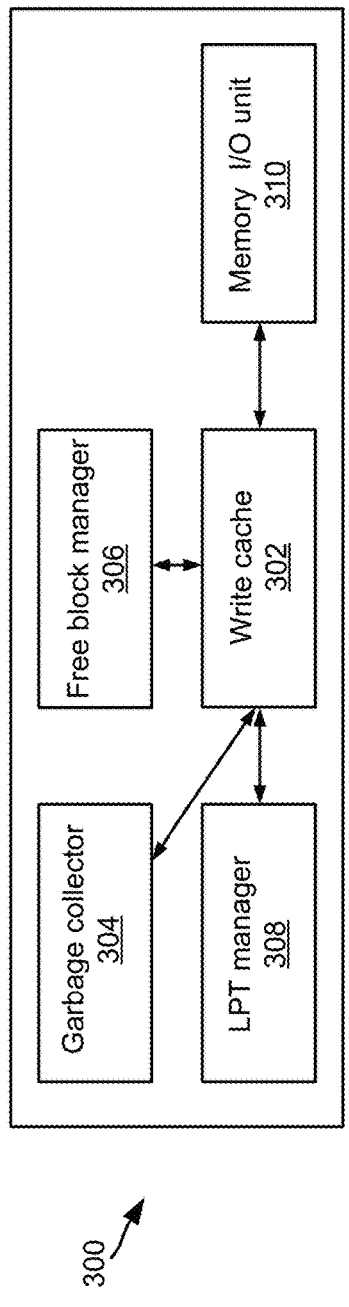
FIG. 3 is a system diagram, in accordance with one embodiment.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired approach. According to an exemplary approach, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages of memory. According to an example, which is in no way intended to limit the invention, the LPT manager 308 may maintain the logical-to-physical mappings of 4KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4A:
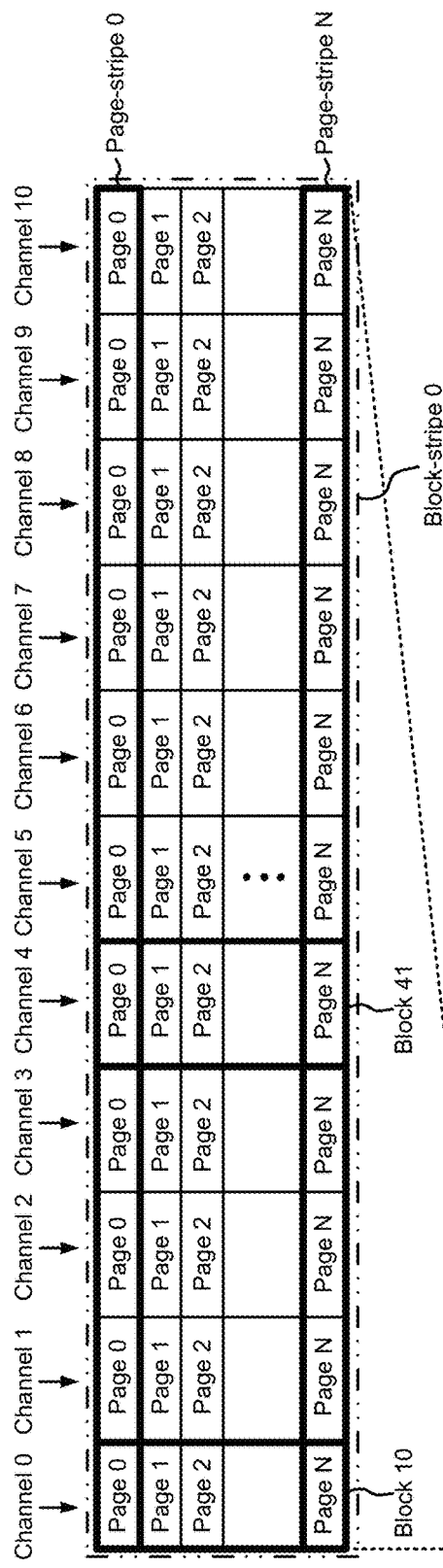
FIG. 4A is a conceptual diagram which includes a block-stripe and page-stripe, in accordance with one embodiment.

To better understand the distinction between block-stripes and page-stripes as used herein, FIG. 4A is a conceptual diagram 400, in accordance with one approach. LEBs are built from block stripes and typically a single block stripe is used to build a LEB. However, alternative approaches may use multiple block stripes to form an LEB. As an option, the present conceptual diagram 400 may be implemented in conjunction with features from any other approach listed herein, such as those described with reference to the other FIGS. However, such conceptual diagram 400 and others presented herein may be used in various applications and/or in permutations which may or may not be specifically described in the illustrative approaches listed herein. Further, the controller conceptual diagram 400 presented herein may be used in any desired environment. Thus, the exemplary non-volatile memory controller conceptual diagram 400 of FIG. 4A may be implemented in a cache architecture. However, depending on the desired approach, the conceptual diagram 400 of FIG. 4A may be implemented in defining the organization of data stored in non-volatile memory. Accordingly, both implementations are described in turn below.

Non-Volatile Memory

Looking now to FIG. 4A, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel forms a respective block-stripe. It follows that a number of block-stripes supported by a given approach of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4A, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4A, the multiple blocks of aggregated Plane 0 constitute Block-stripe 0. While all blocks in a block-stripe typically belong to the same aggregated plane, in some approaches one or more blocks of a block-stripe may belong to different physical planes. It follows that each aggregated plane may include one or more block-stripe. Thus, according to an illustrative approach, Block 0 through Block 10 from different physical planes may constitute a block-stripe.

Regardless of whether the conceptual diagram 400 of FIG. 4A is implemented with non-volatile memory and/or a cache architecture, in different approaches, the number of pages in each block and/or the number of channels in each plane may vary depending on the desired approach. According to an exemplary approach, which is in no way intended to limit the invention, a block may include 1024 pages, but could include more or less in various approaches. Analogously, the number of channels per plane and/or the number of planes may vary depending on the desired approach.

Referring still to FIG. 4A, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 4A:
Figure 4B:
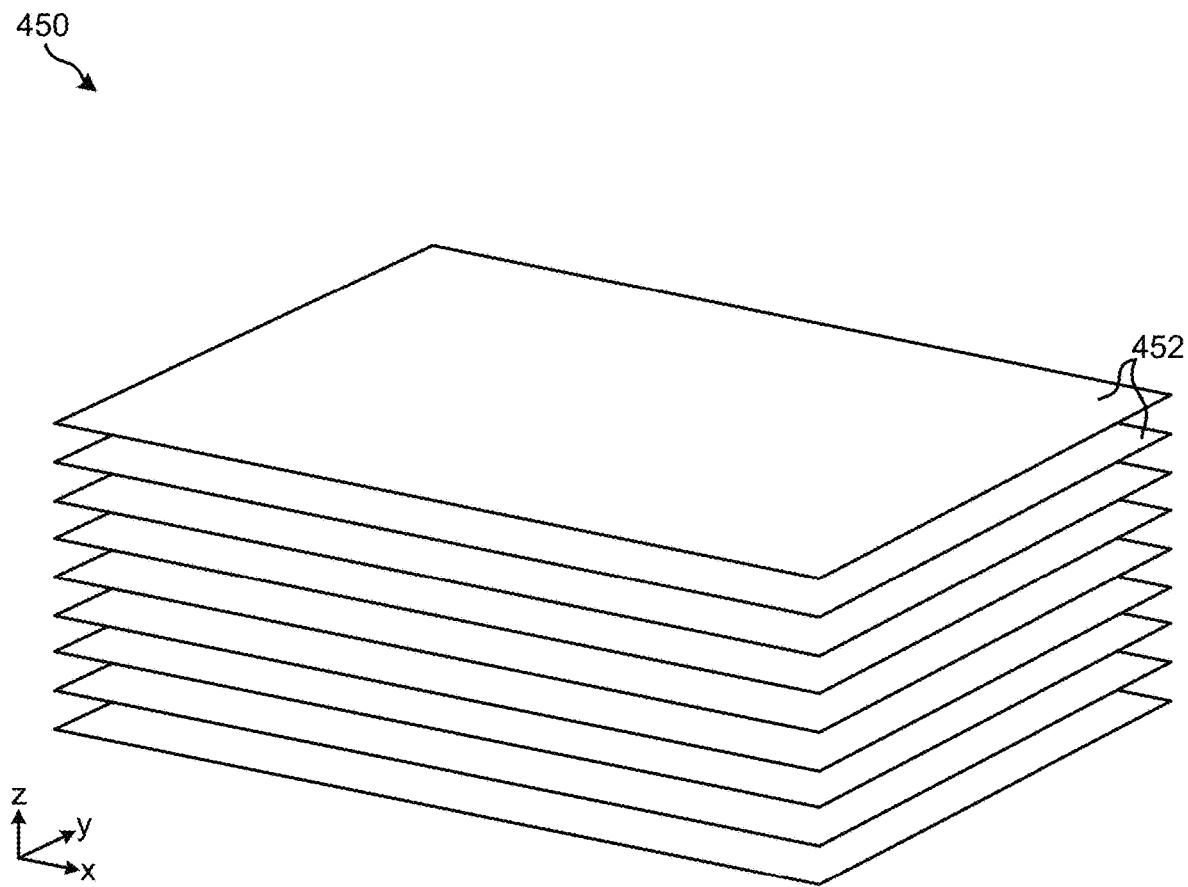
FIG. 4B is a partial perspective view of a 3-D non-volatile memory structure, in accordance with one embodiment.

The general storage architecture illustrated in the conceptual diagram 400 of FIG. 4A is also implemented by using 3-D memory structures in some approaches. For instance, FIG. 4B depicts a representational view of a 3-D non-volatile memory structure 450, in accordance with one approach. As an option, the present structure 450 may be implemented in conjunction with features from any other approach listed herein, such as those described with reference to the other FIGS., such as FIG. 4A. However, such structure 450 and others presented herein may be used in various applications and/or in permutations which may or may not be specifically described in the illustrative approaches listed herein. Further, the structure 450 presented herein may be used in any desired environment. Thus FIG. 4B (and the other FIGS.) may be deemed to include any possible permutation.

As shown, each layer 452 of the 3-D non-volatile memory structure 450 extends along both the x-axis and the y-axis. Each of these layers 452 include a plurality of storage components (not shown), such as voltage supply lines, sensor stacks, transistors, etc., which are used to implement the non-volatile memory devices of the general storage architecture illustrated in the conceptual diagram 400 of FIG. 4A, e.g., as would be appreciated by one skilled in the art after reading the present description. Moreover, the various layers 452 are arranged in a stacked fashion along the z-axis in order to increase storage density and efficiency. Cells from different bitlines along a word-line (typically in the x or y dimension of FIG. 4B) are logically combined to form pages. Thus, each block includes more than one word-line therein, and each word-line has more than one read voltage associated therewith. For example, in TLC, each word-line in a block contains 3 physical pages (e.g., a lower page, an upper page, and an extra page) and a word-line typically belongs to one particular layer in the z dimension (perpendicular to the x-y plane).

For a particular block, which is formed from a grid of cells connected by word-lines and bit-lines, the number of word-lines residing on the same layer is typically small. Therefore, a block can be formed from word-lines of all layers 452. Moreover, word-lines as well as pages in the same block may reside on different layers 452. It should also be noted that a block includes more than one type of page therein (e.g., upper page, lower page, extra page, top page), and at least one read voltage is associated with each of the page types, e.g., as would be appreciated by one skilled in the art after reading the present description.

Again, due to cycling, retention, read disturb, program disturb, etc., or other mechanisms that may be specific to the 3-D NAND Flash technology (e.g., floating gate based or charge trap based technology), process technology, cell and material design, circuit and array architecture, etc., or other specific design factors, the programmed threshold voltage distributions in the memory block may change with writing and erasing data (cycling), reading data (read disturb), time (retention), etc., in a relatively slow or fast manner. In other words, the RBER of Flash memory blocks increases with time and use. As memory blocks are used, each P/E cycle performed on the blocks causes damage of the memory cells, which in turn increases the corresponding RBER.

Block calibration is an important aspect of enhancing endurance and retention for Flash storage systems, e.g., particularly enterprise-level Flash systems, by reducing the RBER experienced. This block calibration corresponds to the read voltages and refers to algorithms that are able to track the changes of the threshold voltage distributions and adjust the read voltages accordingly, thereby significantly reducing the bit errors and improving the performance consistency in the respective device by reducing read tail latency which would otherwise result from error recovery mechanism invocations.

Moreover, adjustments to the read voltages are applied during a read command accordingly. It follows that the threshold voltage represents the voltage associated with turning on the transistor of a given Flash memory cell and its value depends on the amount of charge stored during programming. However, the read voltage is a bias voltage, the value of which is typically between the threshold voltage of two adjacent logical states, e.g., as is explained in further detail below in FIG. 5.

Figure 5:
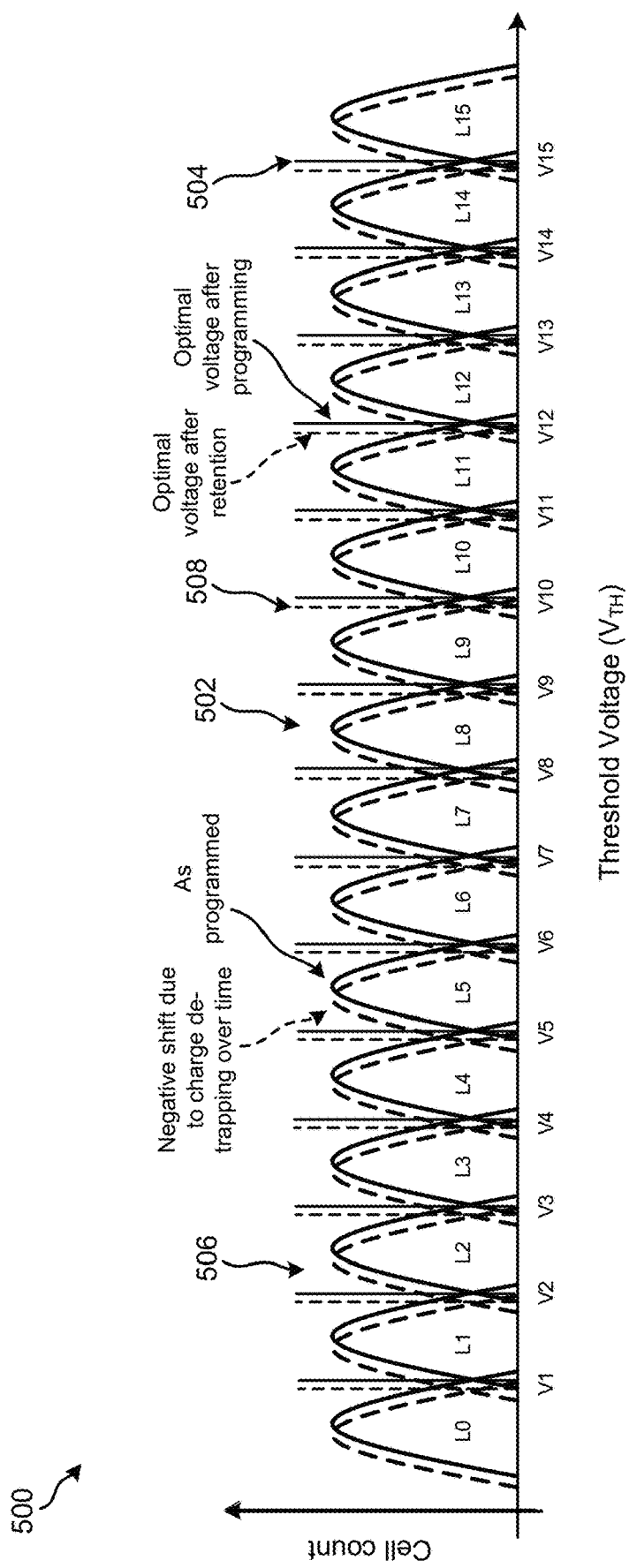
FIG. 5 is a graph which illustrates the threshold voltage shifting phenomenon, in accordance with one embodiment.

Referring momentarily to FIG. 5, a graph 500 illustrating the threshold voltage shifting phenomenon is illustrated in accordance with an example. The x-axis of the graph 500 represents the programmed threshold voltage $V_{TH}$, while the y-axis represents the corresponding cell count of a QLC NAND Flash memory block. In QLC NAND Flash memory, each memory cell stores 4 bits of information, therefore, the $V_{TH}$ distributions correspond to 16 possible discrete levels (L0, L1, . . . , L15). Moreover, each different type of page in a given block of QLC NAND Flash has a different set of the read voltages which correspond thereto. According to an example, which is in no way intended to limit the invention, a lower page corresponds to the V8 read voltage, an upper page corresponds to the V4 and V12 read voltages, an extra page corresponds to the V2, V6, V10, and V14 read voltages, while a top page corresponds to the V1, V3, V5, V7, V9, V11, V13 and V15 read voltages.

The solid distributions 502 indicate the $V_{TH}$ levels after programming. The vertical solid lines 504 indicate the read voltages (V1, . . . , V15) that are optimal for the $V_{TH}$ distributions 502. The dashed distributions 506 indicate a negative shift of the $V_{TH}$ levels due to charge loss over time. Because of this negative shift to lower voltages, the read voltages 504 are no longer optimal. Indeed, a negative offset must be applied to the read voltages in order to account for the changes of the $V_{TH}$ distributions from 502 to 506. The vertical dashed lines 508 indicate the read voltages (V1, ..., V15) that are optimal during retention for the $V_{TH}$ distributions in 506. In general, each of the 16 levels (L0, L1, ..., L15) shown in the figure may have a different $V_{TH}$ shift and thus, each of the 15 read voltages (V1, ..., V15) may have a different optimal shift.

Accordingly, the read voltage shift values (or offset values) are preferably determined shortly after a block has been written to and/or periodically thereafter. The threshold voltage can be considered an index of the cell programmed level (i.e., L0, L1, ..., L15), as determined by measuring the source-drain current when a control gate bias is applied to the memory cell. Typically, upon a read operation, one or more read voltages between adjacent nominal threshold voltage levels are used to determine the memory cell state. As the threshold voltage value of the memory cell changes (as explained above), the read voltages applied during a read operation are preferably shifted accordingly using a set of offset values to obtain optimal readout conditions and minimize the RBER. Subsequently, the optimal read voltage shift values may be updated periodically, e.g., in a background health check, or on demand, e.g., in the event of high bit error count or ECC failure.

Although increases to RBERs are irreparable for some blocks (e.g., such as those caused by prolonged P/E cycles), increases to RBERs caused by events such as retention and/or read disturbances are transient in the sense that the blocks which are affected are not irreversibly damaged. This unfavorable increase in RBERs is remedied when the corresponding memory blocks are recalibrated such that the corresponding read voltages are corrected. In other approaches, blocks experiencing transient RBER increases may be remedied by being erased, programmed, and recalibrated. It is therefore apparent that the RBER of the block depends on the state of the block, which may be determined by the cycling state, the retention state, the read disturb state and/or any combinations thereof. Block recalibration improves the RBER by adjusting the read voltages so that they are optimal under the various changes of the $V_{TH}$ distributions under permanent effects and/or transient effects.

Ideally, the read voltages for each page in a block of memory are updated individually. However, as the storage capacity of memory increases, the amount of computing resources and storage consumed by maintaining a read voltage offset value for each page in each block of memory increases as well. For instance, advancing from 3 bits per cell in TLC NAND Flash memory to 4 bits per cell in QLC NAND Flash memory, each block implements 16 threshold voltage levels (instead of 8 in TLC), and 15 different read voltages (instead of 7 in TLC) to read any of the pages included therein. Moreover, with the improvements in vertical stacking and process technology, the number of layers in every new generation of 3-D NAND Flash increases as well. Subsequently, the number of pages in each block also increases. For example, current 3-D QLC NAND Flash memory may have more than 90 layers and each block may have more than 4000 pages.

It follows that the number of background page read operations that are performed in order to calibrate a given block of memory has increased substantially, thereby also increasing the amount of read latency experienced during the calibration process. These undesirable increases in read latency as well as the number of read operations performed have caused conventional calibration procedures to become increasingly inefficient, thereby degrading performance of the memory as a whole.

In sharp contrast to these conventional shortcomings, various ones of the approaches included herein are able to greatly improve performance by managing the execution of block calibration operations. Some of the approaches herein manage these block calibration operations based on a hierarchical set of priorities that may be updated dynamically and/or on demand. These improvements are particularly prevalent in situations involving memory blocks which may be configured in different modes, e.g., such as single level cell (SLC) mode and multi-bit-per-cell mode, e.g., as will be described in further detail below.

Figure 6A:
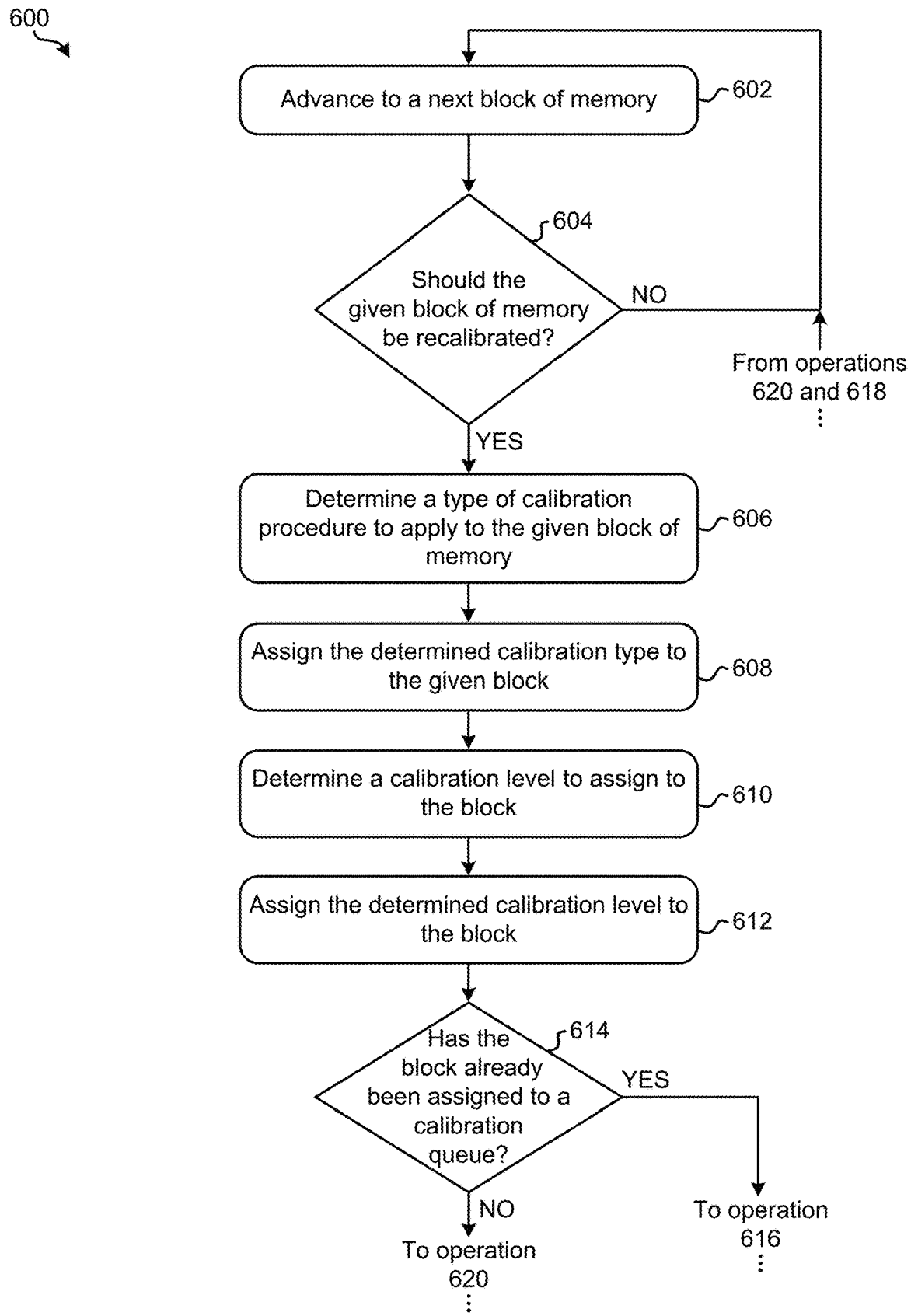
FIG. 6A is a flowchart of a method, in accordance with one embodiment.
Figure 6A:
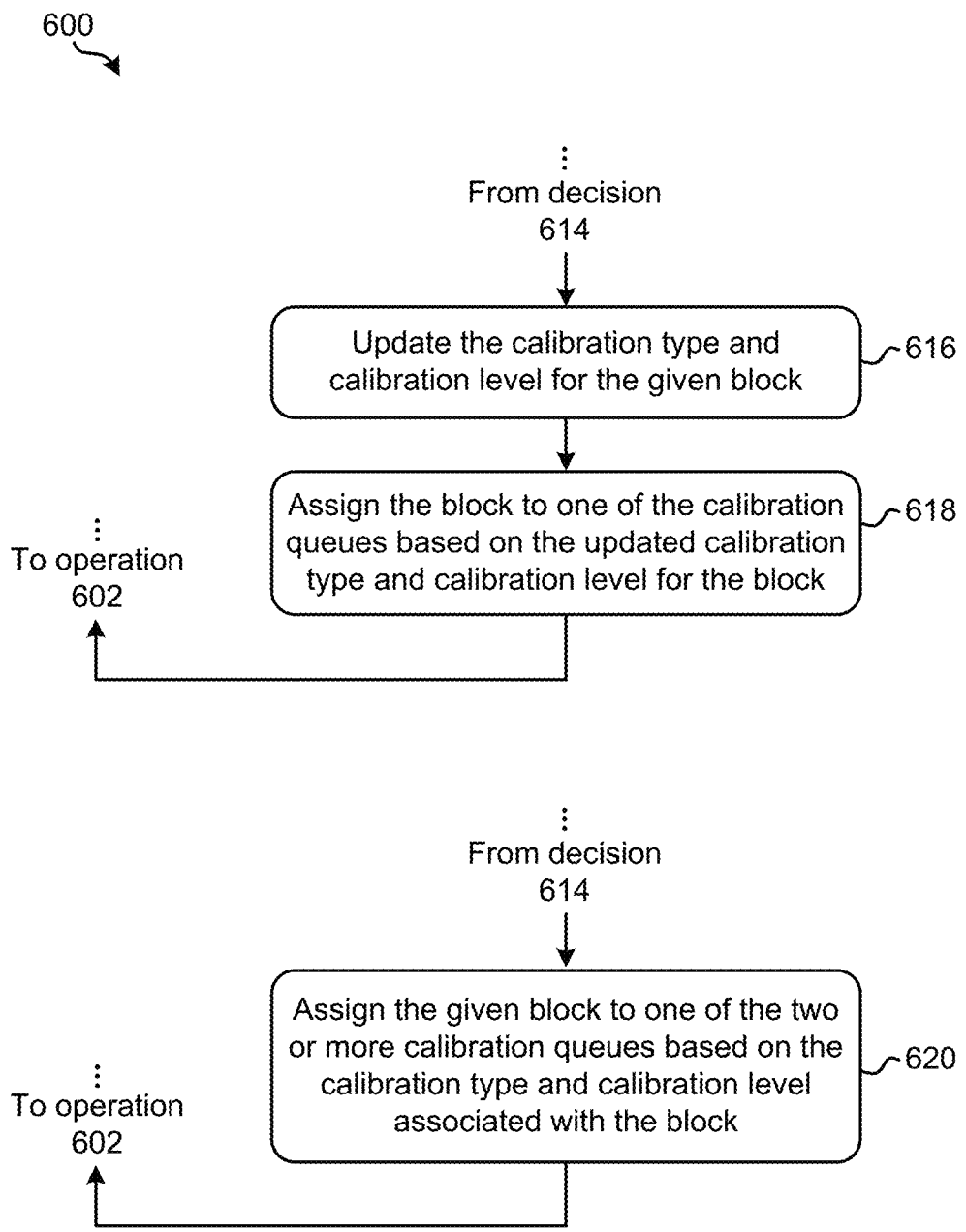

Referring now to FIG. 6A, a flowchart of a method 600 for managing calibration operations for blocks of memory is illustrated in accordance with one embodiment. The method 600 may be performed in accordance with the present invention in any of the environments depicted in FIGS. 1-5, among others, in various embodiments. For instance, any of the processes included in method 600 may be performed with respect to blocks of storage space in NVRAM, e.g., such as 3-D TLC NAND Flash, 3-D QLC NAND Flash, etc., or any other desired type of memory. Furthermore, more or less operations than those specifically described in FIG. 6A may be included in method 600, as would be understood by one of skill in the art upon reading the present descriptions.

Each of the steps of the method 600 may be performed by any suitable component of the operating environment. For example, in various embodiments, the method 600 may be partially or entirely performed by a controller (e.g., Flash controller), a processor, a computer, etc., or some other device having one or more processors therein. Thus, in some embodiments, method 600 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6A, operation 602 of method 600 includes advancing to a next block of memory. With respect to the present description, "a next block of memory" may vary depending on the given approach. For instance, upon initiating method 600, a next block of memory may simply be a first block of memory. In other approaches, a next block of memory may be a next logical block of memory. Moreover, operation 602 may progress between the blocks of memory in any desired manner, e.g., sequentially, randomly, using a pattern, etc. Moreover, operation 602 may be triggered periodically, e.g., every 1 week, by a background process that examines all the NAND blocks, or may be triggered on demand, e.g., in the event of a page read in a block exhibiting a high bit error count or an ECC failure. Moreover, the memory preferably includes NVRAM, and the blocks are preferably configured in multi-bit-per-cell mode. For instance, in some approaches the memory includes 3-D TLC NAND Flash, while in other approaches the memory includes 3-D QLC NAND Flash.

Decision 604 further includes determining whether the given block of memory should be recalibrated. According to some approaches, criteria may be implemented which identify when and if a particular block should be recalibrated. For example, a block may be recalibrated after experiencing a predetermined number of P/E cycles (e.g., 500 P/E cycles), experiencing an undesirably low performance metric (e.g., the number of bit errors exhibiting a predetermined error count threshold), a predetermined amount of time has passed since a last recalibration, etc. This allows for some reduction in the amount of computing overhead experienced, e.g., as would be appreciated by one skilled in the art after reading the present description.

In response to determining that the given block of memory should not be recalibrated for whatever reason, method 600 returns to operation 602 whereby a next block is advanced to before repeating decision 604. However, in response to determining that the given block of memory should be recalibrated, method 600 proceeds to operation 606. There, operation 606 includes determining a type of calibration procedure to apply to the given block of memory. A block of memory may be calibrated using any one or more of a number of different types of calibration procedures. Each calibration type may differ in terms of how it is applied (e.g., how it is performed), the accuracy by which it recalibrates the block, an amount of time and/or computing resources consumed, etc. Thus, different types of calibration procedures may be more desirable for different blocks of memory depending on the situation.

With respect to the present description, each "calibration type" may have a number of different calibration options that are associated with it. For instance, each calibration type may be associated with a specific scheme which indicates the calibration algorithm that is to be used to calibrate the given block of memory. The calibration algorithm which corresponds to a given calibration type may be selected from a set of available algorithms which are predetermined by a user, correspond to manufacturer specifications, are set based on industry standards, correspond to a current operating state of the memory, etc. Each of the calibration algorithms also have a number of performance characteristics which are associated with them.

For instance, a calibration algorithm which involves calculating a common read voltage shift (also referred to herein as "offset") value for each of the different page types in a word-line involves less computing overhead and computation delay than a calibration algorithm which involves calculating a unique voltage offset value for each read voltage in a word-line. Despite the additional computing overhead and computation delay associated with the calibration algorithm which involves calculating a unique voltage offset value for all read voltages in a word-line, more accurate voltage offset determination is also achieved as a result. This improved voltage offset determination may be desirable in situations which have experienced a high read error count. In other approaches, current and/or expected RBER values, error-count margins, etc. may have an effect on the calibration type that is implemented. It follows that different calibration algorithms may be implemented in different situations, e.g., depending on the desired approach.

With continued reference to the present description, each "calibration type" may also have a different type of calibration method associated therewith. In other words, each calibration type may implement a different method to search for the desired voltage shift values. For example, an extensive calibration method that examines an extended set of voltage offset values may be implemented in situations where a high read error count is reported, while a normal calibration method that examines only a selected subset of voltage offset values may be utilized in situations where a low read error count is reported.

A calibration mode and/or scheme may also be identified by the calibration type determined in operation 606. In some approaches, the calibration mode may be used to further identify how to perform the calibration of the given page group, e.g., using one page only or all pages in the group. In other approaches, the calibration scheme may be further identified by the calibration type, where the calibration scheme identifies the scheme that should be used to capture voltage threshold changes due to cell wear. A read voltage shift value may be defined as having two components, a base component that captures the permanent wear of the cells, e.g., due to P/E cycling, and a delta component that captures the temporal changes of the threshold voltage distributions, e.g., due to retention or read disturb effects, and where the delta component is discarded after a block is being erased. For example, in some situations a base calibration may be used, e.g., periodically after 500 program/erase cycles. In other situations, a delta calibration may be uses, e.g., if a given is in data retention phase or read disturb phase.

With continued reference to FIG. 6A, method 600 proceeds from operation 606 to operation 608. There, operation 608 includes assigning the calibration type determined in operation 606 to the block. In some approaches the calibration type may be assigned to the given block by storing the calibration type in a lookup table, while in other approaches operation 608 may involve setting a flag, updating one or more identification bits, etc.

Operation 610 further includes determining a calibration level to assign to the block. In other words, operation 610 includes determining a priority level which is associated with the calibration of the given block. The calibration level associated with a given block of memory may vary depending on a number of factors. For instance, the specific block and/or performance metrics associated with the block may be used to determine a relative priority that the block has to be calibrated, e.g., at least with respect to other blocks. According to an example, which is in no way intended to limit the invention, a block which has experienced greater than 500 bit errors preferably has a calibration level that is greater than a block which has experienced less than 500 bit errors. In other words, the block which has experienced greater than 500 bit errors is given priority over the block which has experienced less than 500 bit errors in the calibration process. However, in other approaches an amount of retention time experienced by a block, the specific calibration type that has been assigned to a block, a number of P/E cycles a block has experienced in a particular configuration, a number of read cycles the block has experienced, a number of read disturb cycles the block has undergone, etc., may play a factor in determining the calibration level that should be assigned to the given block.

Proceeding to operation 612, here method 600 includes assigning the calibration level to the block. As noted above, in some approaches the calibration level may be assigned to the given block by storing the calibration level in a lookup table, while in other approaches operation 612 may involve setting a flag, updating one or more identification bits, etc.

Decision 614 further includes determining whether the given block has already been assigned to one of the calibration queues. A block that has been scheduled for recalibration may be experience processes which reemphasize the desire to have the given block recalibrated before the recalibration may actually be performed. Thus, the calibration type and/or calibration level that have been assigned to the block may be updated before the recalibration has been performed. For instance, as data operations (e.g., write commands) are received, more than one of the operations may correspond to the data that is stored in a particular block. In such situations, the block may already be listed in one of the calibration queues, in which case the updated calibration type and/or calibration level is preferably used to update the calibration queue which the block is assigned to.

In response to determining that the given block has already been assigned to one of the calibration queues, method 600 proceeds to operation 616, which includes updating the calibration type and calibration level for the block. Furthermore, operation 618 includes assigning the block to one of the calibration queues based on the updated calibration type and calibration level for the block. In some instances, the block may be assigned to the same calibration queue it was previously assigned to, but in other instances the block may be assigned to a different calibration queue based on the updated information that is associated therewith. From operation 618, method 600 returns to operation 602, e.g., such that a next block in memory may be advanced to for evaluation and potential recalibration.

However, returning to decision 614, method 600 advances to operation 620 in response to determining that the given block has not already been assigned to (or is at least not currently assigned to) one of the calibration queues. There, operation 620 includes assigning the given block to one of the two or more calibration queues based on the calibration type and calibration level associated with the block. In other words, operation 620 includes using the calibration type and calibration level that have been assigned to the block to determine a specific calibration queue that the block should be assigned to.

A different priority level is assigned to each of the calibration queues such that each of the calibration queues has a priority with respect to the other calibration queues. Moreover, the priority levels are preferably used to determine an order in which blocks assigned to the calibration queues are actually calibrated. According to an example, which is in no way intended to limit the invention, a first calibration queue having a priority level of 0 assigned thereto may be given a higher priority than a second calibration queue having a priority level of 1. It follows that if the first and second calibration queues both have blocks assigned thereto for calibration, blocks that are assigned to the first calibration queue have a higher priority than those assigned to the second calibration queue, and therefore are calibrated first.

Figure 7:
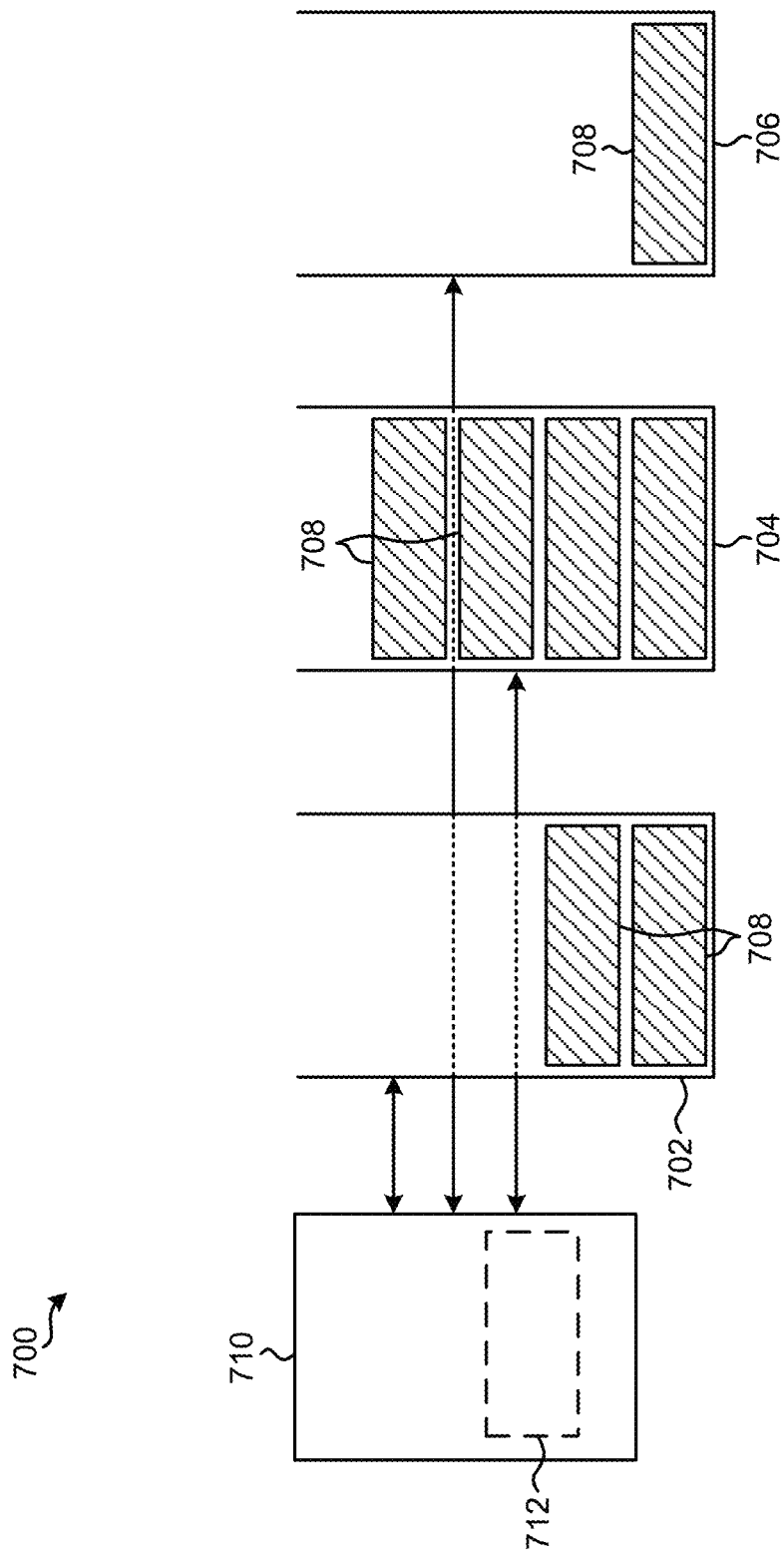
FIG. 7 is a representational view of a number of calibration queues, in accordance with one embodiment.

Moreover, a block that has been assigned to one of the calibration queues is maintained as an entry in the calibration queue. Each entry in each of the calibration queues further includes a block address which corresponds to the respective block, and the calibration type that has been assigned to the respective block. Referring momentarily to FIG. 7, a representational view of a number of calibration queues are depicted in accordance with an illustrative embodiment, which is in no way intended to limit the invention. As shown, each of the calibration queues 702, 704, 706 include a different number of entries 708 therein. Although not specifically depicted in FIG. 7, each of the entries 708 corresponds to a particular block in memory which has been identified for recalibration. Each of the entries 708 further include a block address which corresponds to the storage location of the block, as well as the calibration type which has been assigned to the block. Some of the entries 708 may also include the calibration level that has been assigned to the given block, but in other approaches the calibration level is inherently encompassed by the priority level that is assigned to the given calibration queue.

Referring back to FIG. 6A, method 600 returns to operation 602 from operation 620, e.g., such that a next block in memory may be advanced to for evaluation and potential recalibration. It follows that any one or more of the processes included in method 600 may be repeated in an iterative fashion any number of times in order to monitor memory performance and recalibration of the blocks included therein. As a result, these various processes are desirably able to improve the procedure of managing the calibration of various blocks of memory. For instance, some of the approaches included herein are able to improve read performance by increasing the accuracy by which read voltage shifts are determined, while also avoiding significant increases in calibration and/or computational overhead as a result. This is achieved in some situations by prioritizing different recalibration operations based on a number of factors which correspond to the block itself and how it performs.

The recalibration queues are also preferably monitored such that bottlenecks and performance delays are even further avoided. Accordingly, looking to FIG. 6B, a flowchart of a method 650 for monitoring the calibration queues is illustrated in accordance with one approach. The method 650 may be performed in accordance with the present invention in any of the environments depicted in FIGS. 1-6A, among others, in various approaches. For instance, any of the processes included in method 650 may be performed with respect to blocks of storage space in NVRAM, e.g., such as 3-D TLC NAND Flash, 3-D QLC NAND Flash, etc., or any other desired type of memory. Furthermore, more or less operations than those specifically described in FIG. 6B may be included in method 650, as would be understood by one of skill in the art upon reading the present descriptions.

Each of the steps of the method 650 may be performed by any suitable component of the operating environment. For example, in various approaches, the method 650 may be partially or entirely performed by a controller (e.g., Flash controller), a processor, a computer, etc., or some other device having one or more processors therein. According to some approaches, method 650 may be partially or entirely performed by a supervisor unit which is electrically coupled to the various calibration queues. It follows that in some approaches, method 650 may be a computer-implemented method. It should also be noted that the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 650. Illustrative processors include, but are not limited to, a central processing unit (CPU), an application specific integrated circuit (ASIC), a field programmable gate array (FPGA), etc., combinations thereof, or any other suitable computing device known in the art.

Figure 6B:
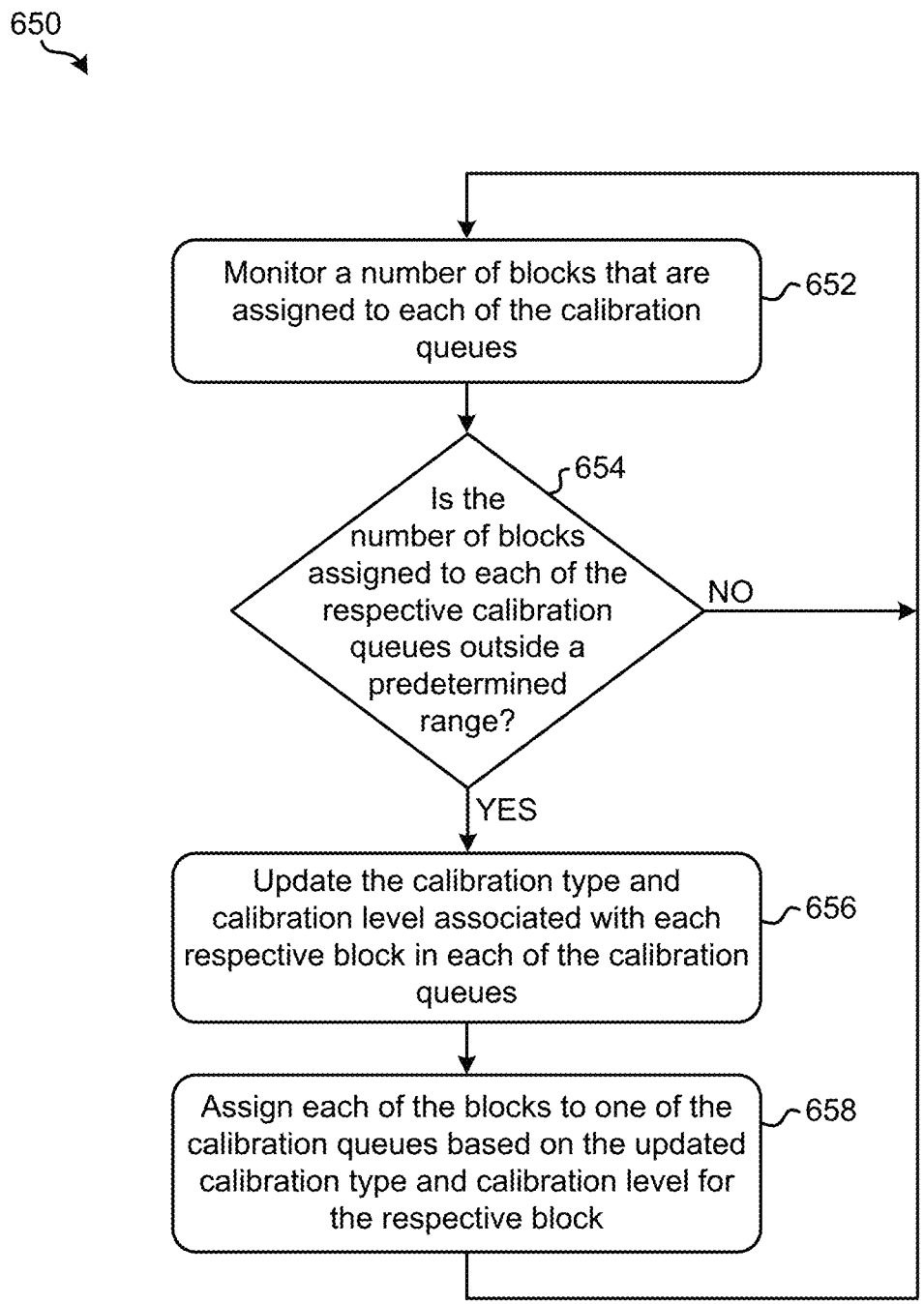
FIG. 6B is a flowchart of a method, in accordance with one embodiment.

As shown in FIG. 6B, operation 652 of method 650 includes monitoring a number of blocks that are assigned to each of the calibration queues. The number of blocks that are currently assigned to a given calibration queue may be determined in some approaches by actually inspecting the calibration queue, while in other approaches a request may be sent to the calibration queue for the number of entries it currently includes. In still other approaches, a number of blocks that have been assigned to the given calibration queue may be compared against a number of the blocks that have already been calibrated to determine the difference which may be used to indicate the number of blocks that are currently assigned to the calibration queue.

Decision 654 further includes determining whether the number of blocks assigned to each of the respective calibration queues is outside a predetermined range. In other words, decision 654 includes determining whether any of the calibration queues have been assigned a number of blocks which is undesirably high. Performing this determination is desirable as it indicates whether the given block is at risk of experiencing bottlenecks and/or performance delays. The blocks that are assigned to a calibration queue which is determined to be at risk of experiencing such inefficiencies may thereby be rearranged, e.g., as will soon become apparent. It should be noted that "outside a predetermined range" is in no way intended to limit the invention. Rather than determining whether a value is outside a range, equivalent determinations may be made, e.g., as to whether a value is above a threshold, whether a value is outside a predetermined range, whether an absolute value is above a threshold, whether a value is below a threshold, etc., depending on the desired approach.

In response to determining that the number of blocks assigned to each of the respective calibration queues is not outside a predetermined range, method 650 returns to operation 652, preferably such that the calibration queues may continue to be monitored. However, in response to determining that the number of blocks assigned to at least one of the calibration queues is outside the predetermined range, method 650 proceeds top operation 656. In other words, method 650 proceeds to operation 656 in response to determining that at least one of the calibration queues has an undesirable number of blocks assigned thereto for recalibration.

Looking to operation 656, the calibration type and calibration level associated with each respective block in each of the calibration queues are updated. The calibration types and/or calibration levels are preferably updated such that the resulting number of blocks that are assigned to each of the calibration queues is redistributed in such a way that bottlenecks, performance delays, and other undesirable effects are avoided. Thus, the manner in which the calibration types and/or calibration levels are updated may depend on the particular approach. According to an example, decision 654 may reveal that the calibration queue with the highest priority level has an undesirably high number of blocks assigned thereto. As a result, operation 656 may involve decreasing the calibration level associated with each block in each calibration queue such that the number of blocks assigned to the highest priority queue decreases. According to another example, decision 654 may reveal that the calibration queue with the lowest priority level has an undesirably high number of blocks assigned thereto. As a result, operation 656 may involve increasing the calibration type and/or calibration level associated with each block in each calibration queue such that the number of blocks assigned to the lowest priority queue decreases, while the number of blocks assigned to the other calibration queues increase.

With continued reference to FIG. 6B, method 650 further includes assigning each of the blocks to one of the calibration queues based on the updated calibration type and calibration level for the respective block. See operation 658. As noted above, in some instances a block may be assigned to the same calibration queue it was prior to updating the calibration type and/or calibration level associated therewith, while in other instances a block may be assigned to a different calibration queue. Regardless of whether each specific block is assigned to a same or different calibration queue, method 650 is desirably able to avoid bottlenecks, performance delays, and other undesirable performance issues by monitoring the number of blocks that are assigned to each of the calibration queues.

From operation 658, method 650 returns to operation 652, e.g., such that the calibration queues may continue to be monitored as blocks are added to, and removed from, the various queues. It follows that the various processes included in method 650 may be repeated in an iterative fashion over time in order to maintain efficient performance of the memory. Moreover, method 650 may be performed in the background while method 600 is being performed such that the two methods operate in tandem to ensure the memory operates efficiently.

Looking now specifically to FIG. 7, a representational view 700 of a number of calibration queues 702, 704, 706 are depicted in accordance with an illustrative embodiment, which is in no way intended to limit the invention. Rather, the present calibration queues 702, 704, 706 may be implemented in conjunction with features from any other embodiment listed herein, such as those described with reference to the other FIGS., such as FIGS. 6A-6B. However, such calibration queues 702, 704, 706 and others presented herein may be used in various applications and/or in permutations which may or may not be specifically described in the illustrative embodiments listed herein. Further, the calibration queues 702, 704, 706 presented herein may be used in any desired environment. Thus FIG. 7 (and the other FIGS.) may be deemed to include any possible permutation.

As noted above, each of the calibration queues 702, 704, 706 include a different number of entries 708 therein. Although not specifically depicted in FIG. 7, each of the entries 708 corresponds to a particular block in memory which has been identified for recalibration. Each of the entries 708 further include a block address which corresponds to the storage location of the block, as well as the calibration type which has been assigned to the block in preferred approaches. Some of the entries 708 may also include the calibration level that has been assigned to the given block, but in other approaches the calibration level is inherently encompassed by the priority level that is assigned to the given calibration queue.

A supervisor unit 710 is also coupled to each of the calibration queues 702, 704, 706. Depending on the approach, the supervisor unit 710 may be implemented in the controller and may run periodically or on demand, e.g., if the size of one or more calibration queues increases above a critical threshold.

Moreover, the supervisor unit 710 includes a scheduler module 712 which may be used to schedule the calibration of the various blocks that have been accumulated in the calibration queues 702, 704, 706. According to preferred approaches, the scheduler module 712 supervises the different calibration queues 702, 704, 706 according to the priority level that has been assigned to each of the respective queues, in addition to avoiding processing bottlenecks and undesirably long queue delays. The scheduler module 712 may achieve this by implementing strict priority schemes, weighted round robin evaluation procedures, etc., which select the next block to be recalibrated from the various calibration queues 702, 704, 706.

The scheduler type may also be dynamically adjusted in some approaches. For instance, the supervisor unit 710 preferably keeps track of the size of each queue and may change the priority level and/or the calibration type of one or more blocks in one or more of the calibration queues 702, 704, 706 depending on a set of global (e.g., for all queues) or local (e.g., for each respective queue) thresholds. For instance, supervisor unit 710 may implement any one or more of the processes included in method 650 of FIG. 7B above. Thus, in the event that the total number of blocks assigned to a given calibration queue is outside a first predetermined range, the supervisor unit 710 may adjust the calibration type assigned to each of the blocks such that all calibrations are accelerated and may thereby be completed without experiencing delays.

Figure 8A:
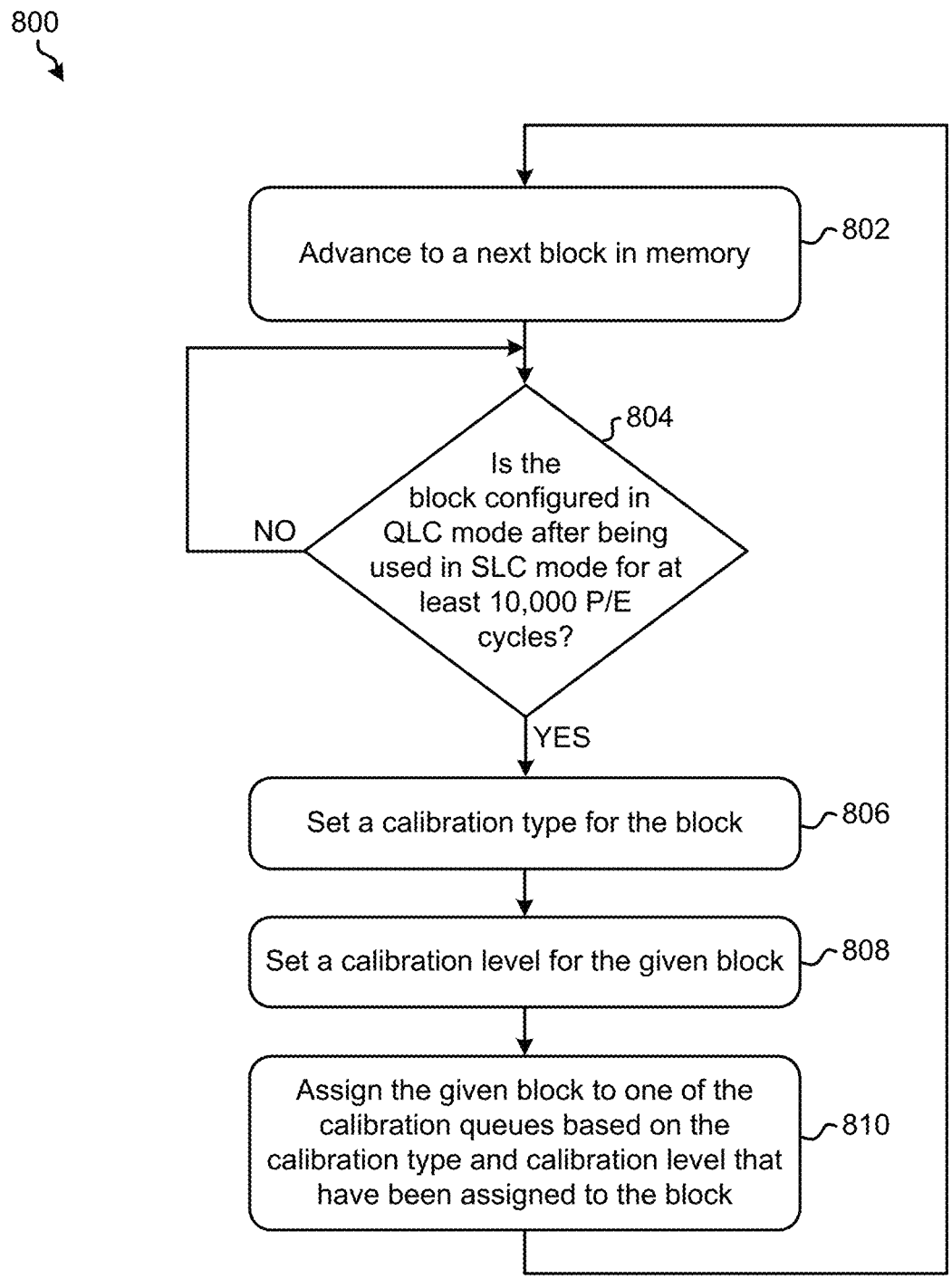
FIG. 8A is a flowchart of a method, in accordance with one embodiment.

FIG. 8A further includes an in-use example of a method 800 for managing calibration operations for blocks of memory. The method 800 in this in-use example (or others) may be implemented in any of the approaches included herein, but is in no way intended to be limiting, e.g., as would be appreciated by one skilled in the art after reading the present description. As shown, method 800 includes advancing to a next block in memory. See operation 802. Decision 804 further includes determining whether the given block should be recalibrated. According to the present in-use example, decision 804 is based on whether the given block is configured to QLC mode from SLC mode and a number of P/E cycles the given block has experienced in its previous configuration mode, i.e., SLC mode. Specifically, decision 804 determines whether the given block has experienced greater than 10,000 P/E cycles in SLC mode before being reconfigured to QLC mode. In response to determining that the given block has not experienced greater than 10,000 P/E cycles while used in SLC mode, method 800 returns to operation 802 and advances to a next block in memory.

Figure 8B:
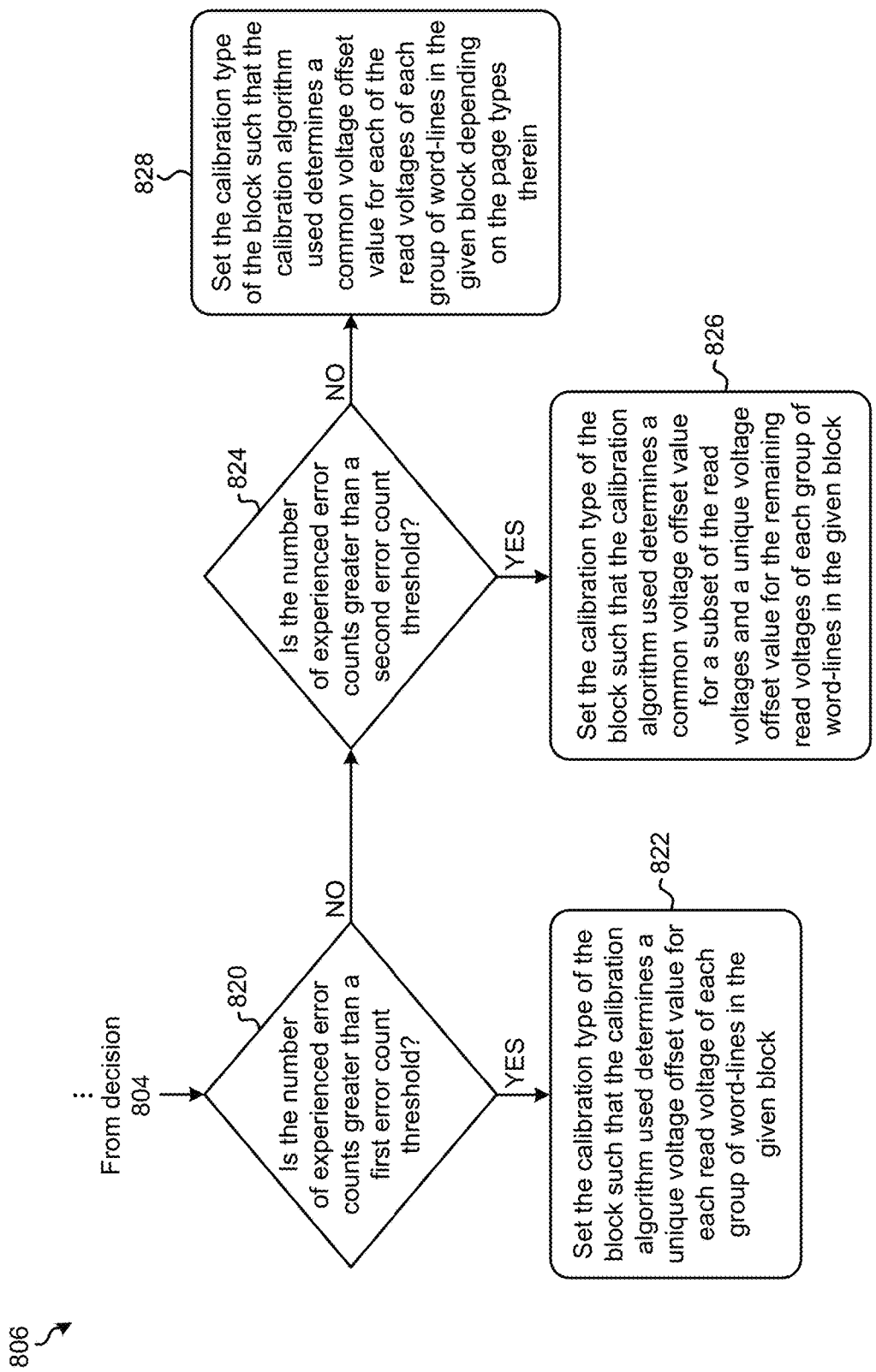
FIG. 8B is a flowchart of sub-processes for one of the operations in the method of FIG. 8A, in accordance with one embodiment.

However, in response to determining that the given block has experienced greater than 10,000 P/E cycles while used in SLC mode, method 800 advances to operation 806 which includes setting a calibration type for the block. Referring momentarily to FIG. 8B, exemplary sub-processes of setting a calibration type for the block are illustrated in accordance with one embodiment, one or more of which may be used to perform operation 806 of FIG. 8A. However, it should be noted that the sub-processes of FIG. 8B are illustrated in accordance with one embodiment which is in no way intended to limit the invention.

As shown, the flowchart of FIG. 8B includes determining whether the number of error counts that have been experienced by the given block is greater than a first error count threshold. See decision 820. In response to determining that the number of error counts that have been experienced by the given block is greater than the first error count threshold, the flowchart proceeds to sub-operation 822. There, sub-operation 822 includes setting the calibration type of the block such that the calibration algorithm used determines a unique voltage offset value for each read voltage of each group of word-lines in the given block, where a group of word-lines may include one or more word-lines and all word-lines of the given block are part of a group of word-lines. Moreover, the calibration method is set to "extensive", while the calibration mode is identified as "group", while the calibration scheme is set to "base", e.g., as would be appreciated by one skilled in the art after reading the present description.

However, returning to decision 820, the flowchart proceeds to decision 824 in response to determining that the number of error counts that have been experienced by the given block is not greater than the first error count threshold. There, decision 824 includes determining whether the number of error counts that have been experienced by the given block is greater than a second error count threshold. The second error count threshold is preferably less than the first error count threshold such that decisions 820 and 824 are able to distinguish between different performance levels. Accordingly, in response to determining that the number of error counts that have been experienced by the given block is greater than the second error count threshold, the flowchart proceeds to sub-operation 826. There, sub-operation 826 includes setting the calibration type of the block such that the calibration algorithm used determines a common voltage offset value for a subset of the read voltages and a unique voltage offset value for the remaining read voltages of each group of word-lines in the given block in comparison to sub-operation 822. Moreover, the calibration method is set to "normal", while the calibration mode is identified as "group", while the calibration scheme is set to "base", e.g., as would be appreciated by one skilled in the art after reading the present description.

Returning again to decision 824, the flowchart proceeds to sub-operation 828 in response to determining that the number of error counts that have been experienced by the given block is not greater than the second error count threshold. There, sub-operation 828 includes setting the calibration type of the block such that the calibration algorithm used determines a common voltage offset value for each of the read voltages of each group of word-lines in the given block depending on the page types therein. Moreover, the calibration method is set to "normal", while the calibration mode is identified as "group", while the calibration scheme is set to "base", e.g., as would be appreciated by one skilled in the art after reading the present description.

It follows that the lower the number of error counts that have been experienced by the given block, the less the amount of computational complexity that is involved with the calibration type assigned to the block.

Figure 8C:
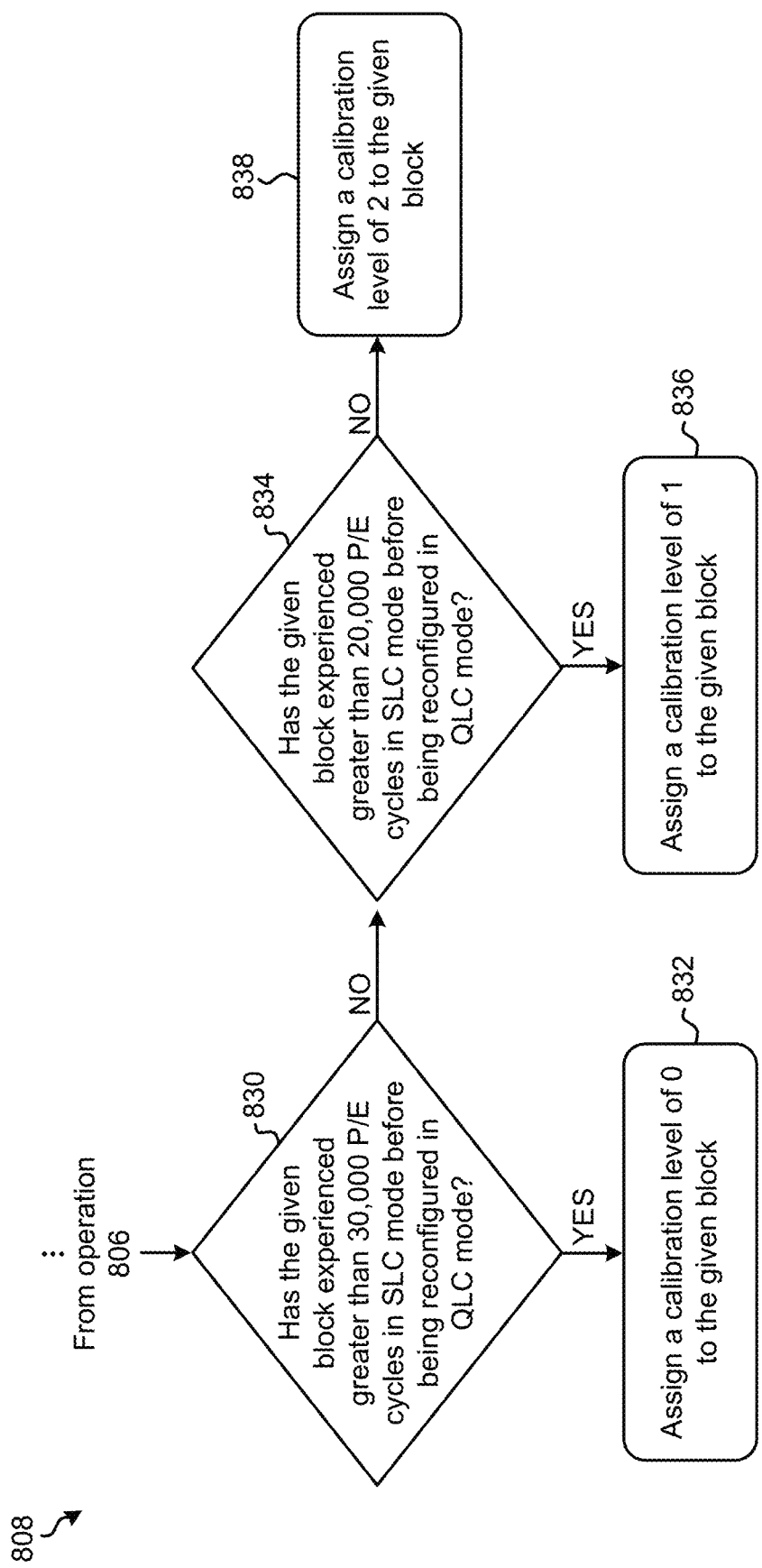
FIG. 8C is a flowchart of sub-processes for one of the operations in the method of FIG. 8A, in accordance with one embodiment.

Returning to FIG. 8A, method 800 proceeds from operation 806 to operation 808 which includes setting a calibration level for the given block. Referring momentarily now to FIG. 8C, exemplary sub-processes of setting a calibration level for the given block are illustrated in accordance with one embodiment, one or more of which may be used to perform operation 808 of FIG. 8A. However, it should be noted that the sub-processes of FIG. 8C are illustrated in accordance with one embodiment which is in no way intended to limit the invention.

As shown, FIG. 8C includes determining whether the given block has experienced greater than 30,000 P/E cycles in SLC mode before configured in QLC mode. See decision 830. In other words, decision 830 includes determining whether the block has experienced greater than 30,000 P/E cycles while used in SLC mode before being reconfigured to QLC mode. In response to determining that the block has experienced greater than 30,000 P/E cycles in SLC mode before being reconfigured in QLC mode, the flowchart proceeds to sub-operation 832, which includes assigning a calibration level of 0 to the given block.

However, returning to decision 830, the flowchart proceeds to decision 834 in response to determining that the given block has not experienced greater than 30,000 P/E cycles in SLC mode before being reconfigured in QLC mode. There, decision 834 includes determining whether the given block has experienced greater than 20,000 P/E cycles in SLC mode before being reconfigured in QLC mode. In response to determining that the given block has experienced greater than 20,000 P/E cycles in SLC mode before being reconfigured in QLC mode, the flowchart proceeds to sub-operation 836. There, sub-operation 836 includes assigning a calibration level of 1 to the given block. The flowchart may alternatively proceed to sub-operation 838 in response to determining that the given block has not experienced greater than 20,000 P/E cycles in SLC mode before being reconfigured in QLC mode. There, sub-operation 838 includes setting a calibration level of 2 to the given block.

It follows that in the present in-use example, the lower the numerical value of the level that is assigned to a block, the higher the priority of the block, e.g., at least with respect to the other calibration levels.

Returning again to FIG. 8A, method 800 proceeds from operation 808 to operation 810 which includes assigning the given block to one of the calibration queues based on the calibration type and calibration level that have been assigned to the block. In some approaches, assigning the given block to one of the calibration queues may include determining whether the block has already been assigned to one of the calibration queues, e.g., according to any of the approaches included herein.

While the in-use example illustrated in FIGS. 8A-8C use a number of error counts experienced by the block to determine the calibration type and/or calibration level to assign to the given block, other performance metrics may be used. For instance, in other in-use examples, a number of read cycles experienced by the block may be used to determine the calibration type and/or calibration level to assign to the block. According to some illustrative approaches, the calibration type and/or calibration level may be assigned based on the number of page reads that have been performed since the block has been programmed, a fixed number read cycles n1, n2, n3, etc. after a block has been programmed (e.g., n1<n2<n3, etc.), a number of P/E cycles experienced by the block (e.g., each number of P/E cycles since first operation of the block, each number of P/E cycles since a last calibration was performed, etc.), an amount of retention time experienced by the block (e.g., each predetermined amount of time since being programmed, predetermined time intervals after a block has been programmed, etc.), etc., or any other desired performance metrics.

It should also be noted that none of the particular configurations included in any of the approaches included herein are intended to be limiting. For instance, the number and/or type of pages included in a given word-line and/or block of memory, the number and/or values of the read voltages, the number and/or values of the threshold voltage levels, etc., included in any of the approaches herein are in no way intended to be limiting, but rather have been presented by way of example only.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

Figure 9:
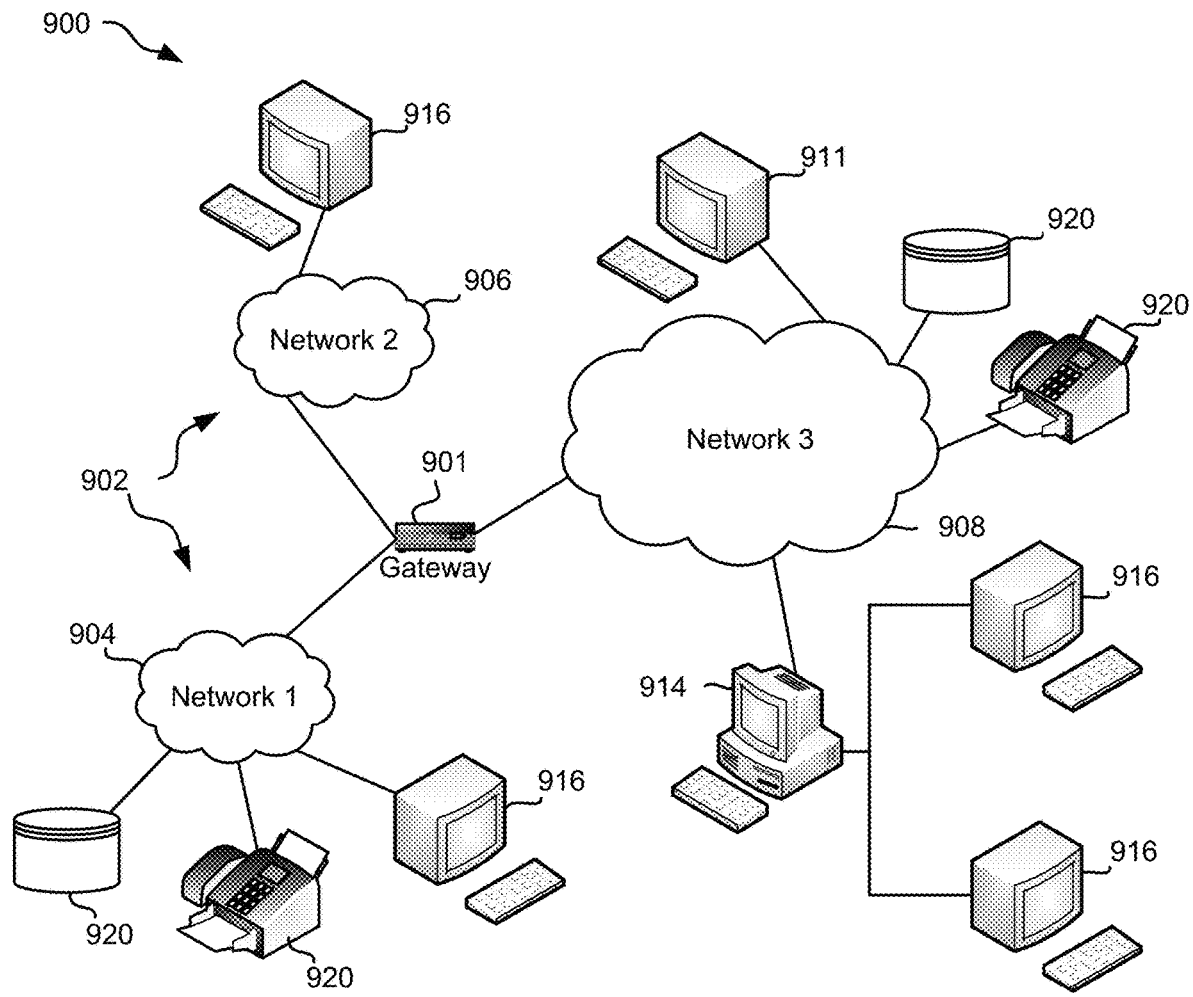
FIG. 9 is a network architecture, in accordance with one embodiment.

FIG. 9 illustrates a network architecture 900, in accordance with one approach. As shown in FIG. 9, a plurality of remote networks 902 are provided including a first remote network 904 and a second remote network 906. A gateway 901 may be coupled between the remote networks 902 and a proximate network 908. In the context of the present network architecture 900, the networks 904, 906 may each take any form including, but not limited to a LAN, a WAN such as the Internet, public switched telephone network (PSTN), internal telephone network, etc.

In use, the gateway 901 serves as an entrance point from the remote networks 902 to the proximate network 908. As such, the gateway 901 may function as a router, which is capable of directing a given packet of data that arrives at the gateway 901, and a switch, which furnishes the actual path in and out of the gateway 901 for a given packet.

Further included is at least one data server 914 coupled to the proximate network 908, and which is accessible from the remote networks 902 via the gateway 901. It should be noted that the data server(s) 914 may include any type of computing device/groupware. Coupled to each data server 914 is a plurality of user devices 916. Such user devices 916 may include a desktop computer, laptop computer, handheld computer, printer, and/or any other type of logic-containing device. It should be noted that a user device 911 may also be directly coupled to any of the networks, in some approaches.

A peripheral 920 or series of peripherals 920, e.g., facsimile machines, printers, scanners, hard disk drives, networked and/or local data storage units or systems, etc., may be coupled to one or more of the networks 904, 906, 908. It should be noted that databases and/or additional components may be utilized with, or integrated into, any type of network element coupled to the networks 904, 906, 908. In the context of the present description, a network element may refer to any component of a network.

According to some approaches, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some approaches.

In other approaches, one or more networks 904, 906, 908, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 10:
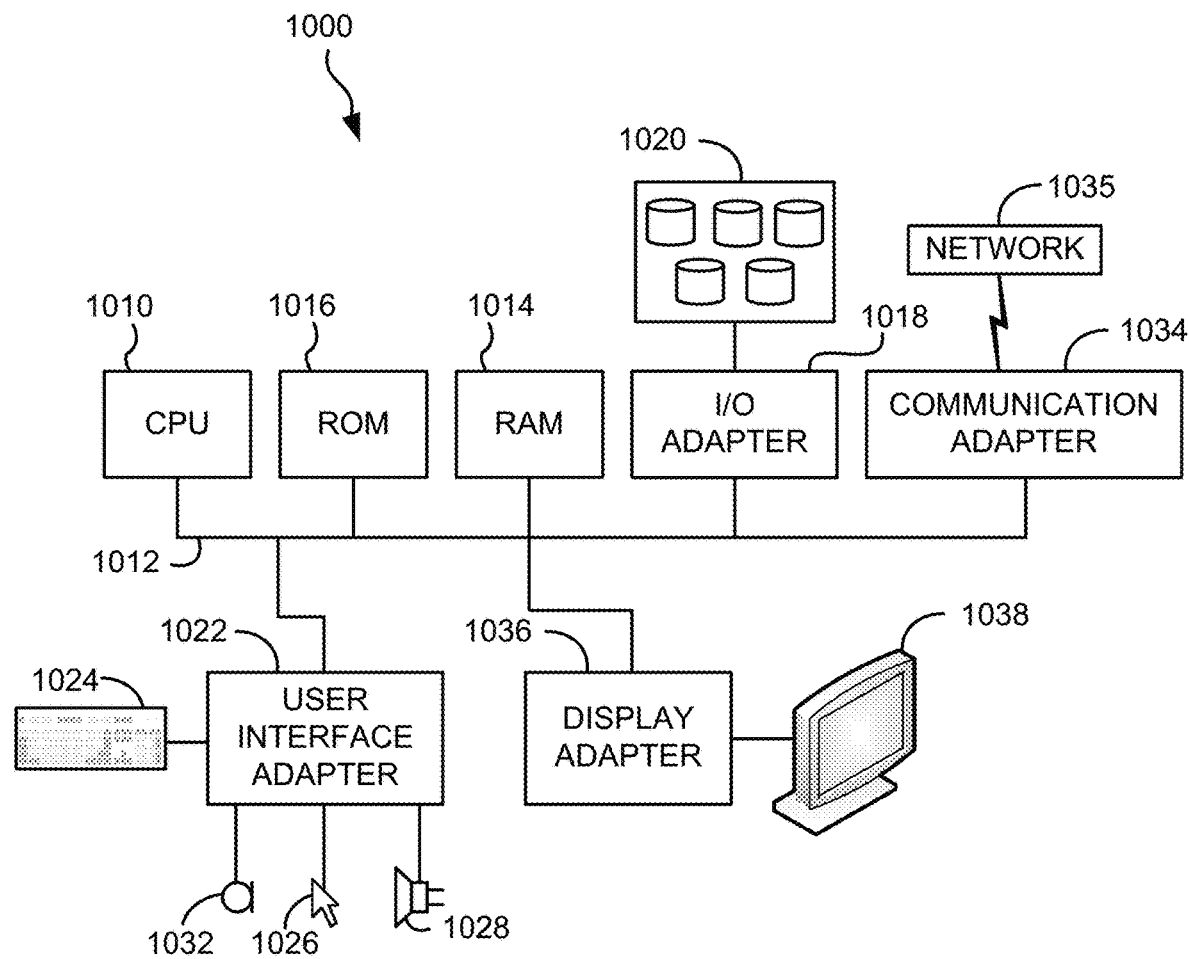
FIG. 10 is a representative hardware environment that may be associated with the servers and/or clients of FIG. 9, in accordance with one embodiment.

FIG. 10 shows a representative hardware environment associated with a user device 916 and/or server 914 of FIG. 9, in accordance with one approach. FIG. 10 illustrates a typical hardware configuration of a processor system 1000 having a central processing unit 1010, such as a microprocessor, and a number of other units interconnected via a system bus 1012, according to one approach. In some approaches, central processing unit 1010 may include any of the approaches described above with reference to the one or more processors 210 of FIG. 2.

The processor system 1000 shown in FIG. 10 includes a RAM 1014, Read Only Memory (ROM) 1016, and an I/O adapter 1018. According to some approaches, which are in no way intended to limit the invention, I/O adapter 1018 may include any of the approaches described above with reference to I/O adapter 218 of FIG. 2. Referring still to processor system 1000 of FIG. 10, the aforementioned components 1014, 1016, 1018 may be used for connecting peripheral devices such as storage subsystem 1020 to the bus 1012. In some approaches, storage subsystem 1020 may include a similar and/or the same configuration as data storage system 220 of FIG. 2. According to an example, which is in no way intended to limit the invention, storage subsystem 1020 may include non-volatile data storage cards, e.g., having NVRAM memory cards, RAM, ROM, and/or some other known type of non-volatile memory, in addition to RAID controllers as illustrated in FIG. 2.

With continued reference to FIG. 10, a user interface adapter 1022 for connecting a keyboard 1024, a mouse 1026, a speaker 1028, a microphone 1032, and/or other user interface devices such as a touch screen, a digital camera (not shown), etc., to the bus 1012.

Processor system 1000 further includes a communication adapter 1034 which connects the processor system 1000 to a communication network 1035 (e.g., a data processing network) and a display adapter 1036 which connects the bus 1012 to a display device 1038.

The processor system 1000 may have resident thereon an operating system such as the MICROSOFT WINDOWS Operating System (OS), a MAC OS, a UNIX OS, etc. It will be appreciated that a preferred approach may also be implemented on platforms and operating systems other than those mentioned. A preferred approach may be written using JAVA, XML, C, and/or C++ language, or other programming languages, along with an object oriented programming methodology. Object oriented programming (OOP), which has become increasingly used to develop complex applications, may be used.

Figure 11:
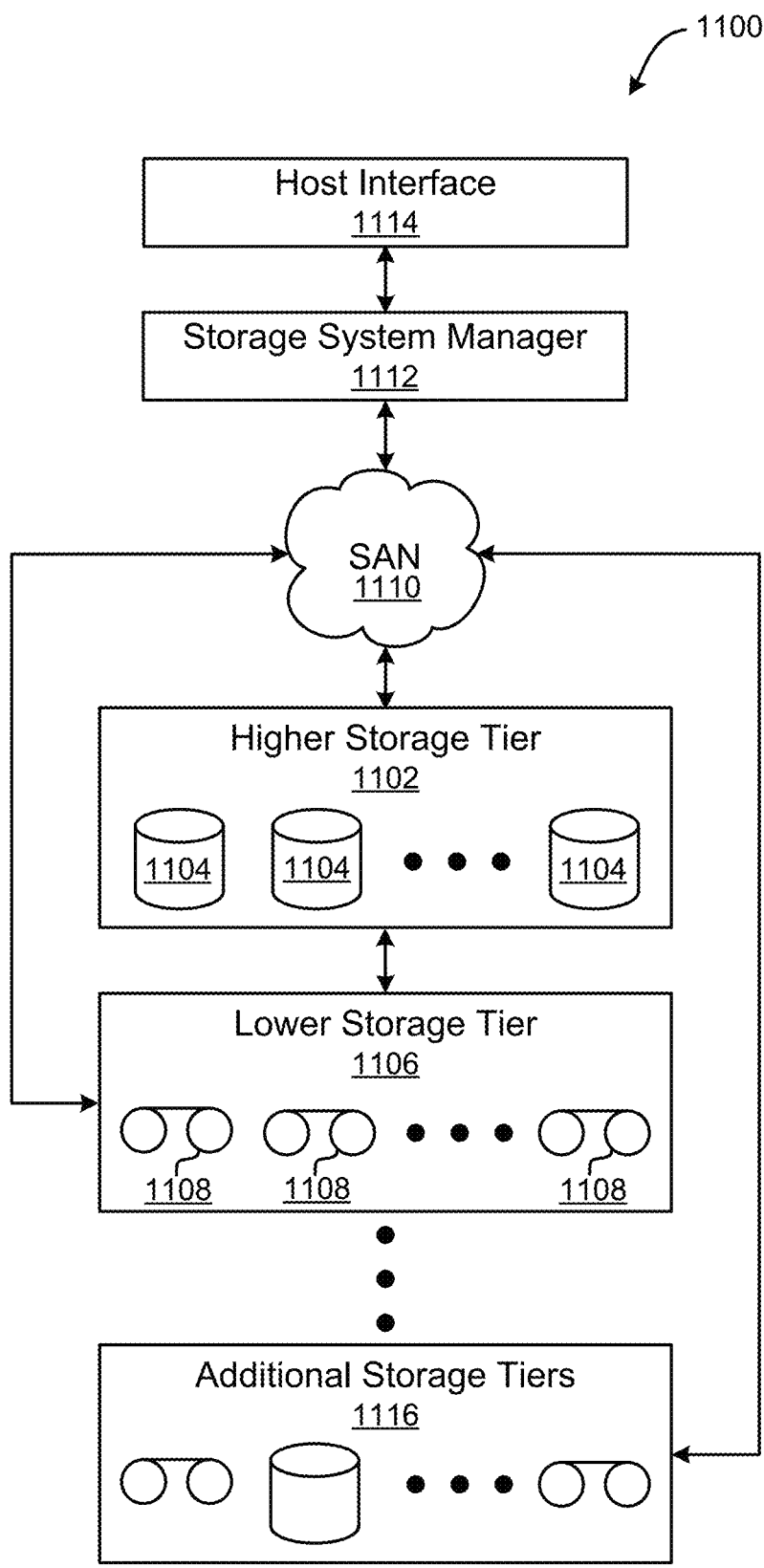
FIG. 11 is a tiered data storage system in accordance with one embodiment.

Moreover, FIG. 11 illustrates a storage system 1100 which implements high level (e.g., SSD) storage tiers in combination with lower level (e.g., magnetic tape) storage tiers, according to one approach. Note that some of the elements shown in FIG. 11 may be implemented as hardware and/or software, according to various approaches. The storage system 1100 may include a storage system manager 1112 for communicating with a plurality of media on at least one higher storage tier 1102 and at least one lower storage tier 1106. However, in other approaches, a storage system manager 1112 may communicate with a plurality of media on at least one higher storage tier 1102, but no lower storage tier. The higher storage tier(s) 1102 preferably may include one or more random access and/or direct access media 1104, such as hard disks, nonvolatile memory (NVM), NVRAM), solid state memory in SSDs, Flash memory, SSD arrays, Flash memory arrays, etc., and/or others noted herein or known in the art. According to illustrative examples, FIGS. 3-4 show exemplary architectures of SSD systems which may be used as a higher storage tier 1102 depending on the desired approach.

Referring still to FIG. 11, the lower storage tier(s) 1106 preferably includes one or more lower performing storage media 1108, including sequential access media such as magnetic tape in tape drives and/or optical media, slower accessing HDDs, slower accessing SSDs, etc., and/or others noted herein or known in the art. One or more additional storage tiers 1116 may include any combination of storage memory media as desired by a designer of the system 1100. Thus, the one or more additional storage tiers 1116 may, in some approaches, include a SSD system architecture similar or the same as those illustrated in FIGS. 1-2. Also, any of the higher storage tiers 1102 and/or the lower storage tiers 1106 may include any combination of storage devices and/or storage media.

The storage system manager 1112 may communicate with the storage media 1104, 1108 on the higher storage tier(s) 1102 and lower storage tier(s) 1106 through a network 1110, such as a storage area network (SAN), as shown in FIG. 11, or some other suitable network type. The storage system manager 1112 may also communicate with one or more host systems (not shown) through a host interface 1114, which may or may not be a part of the storage system manager 1112. The storage system manager 1112 and/or any other component of the storage system 1100 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more approaches, the storage system 1100 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1102, may include a majority of SSD storage media for storing data in a higher performing storage environment, and remaining storage tiers, including lower storage tier 1106 and additional storage tiers 1116 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1102, while data not having one of these attributes may be stored to the additional storage tiers 1116, including lower storage tier 1106. Of course, one of skill in the art, upon reading the present descriptions, may devise many other combinations of storage media types to implement into different storage schemes, according to the approaches presented herein.

According to some approaches, the storage system (such as 1100) may include logic configured to receive a request to open a data set, logic configured to determine if the requested data set is stored to a lower storage tier 1106 of a tiered data storage system 1100 in multiple associated portions, logic configured to move each associated portion of the requested data set to a higher storage tier 1102 of the tiered data storage system 1100, and logic configured to assemble the requested data set on the higher storage tier 1102 of the tiered data storage system 1100 from the associated portions.

Of course, this logic may be implemented as a method on any device and/or system or as a computer program product, according to various embodiments.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for managing block calibration operations, comprising:
    determining a type of calibration procedure to apply to a block of memory;
    assigning the calibration type to the block;
    determining a calibration level to assign to the block;
    assigning the calibration level to the block; and
    assigning the block to one of two or more calibration queues based on the calibration type and calibration level associated with the block,
    wherein a different priority level is assigned to each of the calibration queues,
    wherein the priority levels determine an order in which blocks assigned to the calibration queues are calibrated.

2. The computer-implemented method of claim 1, comprising, for each of the calibration queues:
    monitoring a number of blocks that are assigned to a given calibration queue;
    determining whether the number of blocks assigned to the given calibration queue is outside a predetermined range;
    in response to determining that the number of blocks assigned to the given calibration queue is outside a predetermined range, updating a calibration type and calibration level associated with each respective block in each of the calibration queues; and
    assigning each block to one of the calibration queues based on the updated calibration type and calibration level for the respective block.

3. The computer-implemented method of claim 1, wherein the calibration level is determined based on one or more performance metrics associated with the block, wherein the one or more performance metrics are selected from the group consisting of: a number of program/erase cycles, a retention time, and a number of read cycles.

4. The computer-implemented method of claim 1, wherein a block assigned to one of the calibration queues is maintained as an entry in the said one calibration queue, wherein each entry in each of the calibration queues includes: a block address which corresponds to a respective block, and a calibration type assigned to the respective block.

5. The computer-implemented method of claim 1, wherein the memory is non-volatile random access memory (NVRAM).

6. The computer-implemented method of claim 5, wherein the NVRAM includes three-dimensional triple-level-cell NAND Flash.

7. The computer-implemented method of claim 5, wherein the NVRAM includes three-dimensional quad-level-cell NAND Flash.

8. A computer program product for managing block calibration operations, the computer program product comprising a computer readable storage medium having program instructions embodied therewith, the program instructions readable and/or executable by a processor to cause the processor to:
    determine, by the processor, a type of calibration procedure to apply to a block of memory;
    assign, by the processor, the calibration type to the block;
    determine, by the processor, a calibration level to assign to the block;
    assign, by the processor, the calibration level to the block; and
    assign, by the processor, the block to one of two or more calibration queues based on the calibration type and calibration level associated with the block,
    wherein a different priority level is assigned to each of the calibration queues,
    wherein the priority levels determine an order in which blocks assigned to the calibration queues are calibrated.

9. The computer program product of claim 8, wherein the program instructions are readable and/or executable by the processor to cause the processor to, for each of the calibration queues:
    monitor, by the processor, a number of blocks that are assigned to a given calibration queue;
    determine, by the processor, whether the number of blocks assigned to the given calibration queue is outside a predetermined range;
    in response to determining that the number of blocks assigned to the given calibration queue is outside a predetermined range, update, by the processor, a calibration type and calibration level associated with each respective block in each of the calibration queues; and
    assign, by the processor, each block to one of the calibration queues based on the updated calibration type and calibration level for the respective block.

10. The computer program product of claim 8, wherein the calibration level is determined based on one or more performance metrics associated with the block, wherein the one or more performance metrics are selected from the group consisting of: a number of program/erase cycles, a retention time, and a number of read cycles.

11. The computer program product of claim 8,
    wherein a block assigned to one of the calibration queues is maintained as an entry in the said one calibration queue, wherein each entry in each of the calibration queues includes: a block address which corresponds to a respective block, and a calibration type assigned to the respective block.

12. The computer program product of claim 8, wherein the memory is non-volatile random access memory (NVRAM).

13. The computer program product of claim 12, wherein the NVRAM includes three-dimensional triple-level-cell NAND Flash.

14. The computer program product of claim 12, wherein the NVRAM includes three-dimensional quad-level-cell NAND Flash.

15. A system, comprising:
a plurality of non-volatile random access memory (NVRAM) blocks configured to store data;
a processor; and
logic integrated with and/or executable by the processor, the logic being configured to, for each of the blocks:
determine, by the processor, a type of calibration procedure to apply to a given block of memory;
assign, by the processor, the calibration type to the given block;
determine, by the processor, a calibration level to assign to the given block;
assign, by the processor, the calibration level to the given block; and
assign, by the processor, the given block to one of two or more calibration queues based on the calibration type and calibration level associated with the given block,
wherein a different priority level is assigned to each of the calibration queues,
wherein the priority levels determine an order in which blocks assigned to the calibration queues are calibrated.

16. The system of claim 15, the logic being configured to:
monitor, by the processor, a number of blocks that are assigned to a given calibration queue;
determine, by the processor, whether the number of blocks assigned to the given calibration queue is outside a predetermined range;
in response to determining that the number of blocks assigned to the given calibration queue is outside a predetermined range, update, by the processor, a calibration type and calibration level associated with each respective block in each of the calibration queues; and
assign, by the processor, each block to one of the calibration queues based on the updated calibration type and calibration level for the respective block.

17. The system of claim 15, wherein the calibration level is determined based on one or more performance metrics associated with the given block, wherein the one or more performance metrics are selected from the group consisting of: a number of program/erase cycles, a retention time, and a number of read cycles.

18. The system of claim 15, wherein a block assigned to one of the calibration queues is maintained as an entry in said one calibration queue, wherein each entry in each of the calibration queues includes: a block address which corresponds to a respective block, and a calibration type assigned to the respective block.

19. The system of claim 15, wherein at least some of the NVRAM blocks are included in three-dimensional triple-level-cell NAND Flash.

20. The system of claim 15, wherein at least some of the NVRAM blocks are included in three-dimensional quad-level-cell NAND Flash.

* * * * *